United States Patent
Park et al.

(10) Patent No.: US 10,476,000 B2
(45) Date of Patent: Nov. 12, 2019

(54) METHOD OF FORMING A LAYER AND A METHOD OF FABRICATING A VARIABLE RESISTANCE MEMORY DEVICE USING THE SAME

(71) Applicant: Samsung Electronics Co., Ltd., Suwon-si, Gyeonggi-do (KR)

(72) Inventors: Jeonghee Park, Hwaseong-si (KR); Kyoung Sun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/927,481

(22) Filed: Mar. 21, 2018

(65) Prior Publication Data

US 2018/0277758 A1    Sep. 27, 2018

(30) Foreign Application Priority Data

Mar. 22, 2017    (KR) .................. 10-2017-0036231

(51) Int. Cl.
| | | |
|---|---|---|
| *C23C 16/34* | (2006.01) | |
| *H01L 45/00* | (2006.01) | |
| *H01L 27/24* | (2006.01) | |
| *C23C 16/455* | (2006.01) | |
| *G11C 13/00* | (2006.01) | |

(52) U.S. Cl.
CPC .......... *H01L 45/1253* (2013.01); *C23C 16/34* (2013.01); *C23C 16/345* (2013.01); *C23C 16/45523* (2013.01); *C23C 16/45525* (2013.01); *H01L 27/2427* (2013.01); *H01L 27/2463* (2013.01); *H01L 27/2481* (2013.01); *H01L 45/16* (2013.01); *G11C 13/0004* (2013.01); *G11C 13/0007* (2013.01); *G11C 2213/31* (2013.01); *G11C 2213/32* (2013.01); *G11C 2213/52* (2013.01); *G11C 2213/71* (2013.01); *G11C 2213/72* (2013.01); *H01L 45/04* (2013.01); *H01L 45/06* (2013.01); *H01L 45/08* (2013.01); *H01L 45/1233* (2013.01); *H01L 45/1246* (2013.01); *H01L 45/143* (2013.01); *H01L 45/144* (2013.01); *H01L 45/146* (2013.01); *H01L 45/147* (2013.01)

(58) Field of Classification Search
CPC . H01L 45/16; C23C 16/345; C23C 16/45523; C23C 16/34; C23C 16/45525
See application file for complete search history.

(56) References Cited

U.S. PATENT DOCUMENTS

| | | |
|---|---|---|
| 6,270,572 B1 | 8/2001 | Kim et al. |
| 8,470,635 B2 | 6/2013 | Cha et al. |
| 8,623,697 B2 | 1/2014 | Magistretti et al. |
| 9,082,702 B2 | 7/2015 | Lei et al. |

(Continued)

FOREIGN PATENT DOCUMENTS

| | | |
|---|---|---|
| KR | 1019990012246 | 2/1999 |
| KR | 20120062293 | 6/2012 |

*Primary Examiner* — Kyoung Lee
*Assistant Examiner* — Christina A Sylvia
(74) *Attorney, Agent, or Firm* — Onello & Mello, LLP

(57) ABSTRACT

A method of forming a target layer in semiconductor fabrication is disclosed that includes steps of forming a first layer by performing a first process at least one time and forming a second layer by performing a second process at least one time, wherein the first process may include supplying a first source gas, supplying a second source gas several times, and supplying an inert gas several times.

10 Claims, 20 Drawing Sheets

(56) References Cited

U.S. PATENT DOCUMENTS

| | | |
|---|---|---|
| 9,159,608 B2 | 10/2015 | Park et al. |
| 9,287,498 B2 | 3/2016 | Kau |
| 2005/0054196 A1* | 3/2005 | Wu .................. H01L 21/28562 438/680 |
| 2006/0024964 A1* | 2/2006 | Seo ........................ C23C 16/34 438/680 |
| 2008/0032465 A1* | 2/2008 | Ahn ..................... C23C 16/308 438/142 |
| 2011/0127485 A1 | 6/2011 | Cha et al. |
| 2012/0001145 A1 | 1/2012 | Magistretti et al. |
| 2013/0221445 A1 | 8/2013 | Lei et al. |
| 2013/0256624 A1 | 10/2013 | Kau |
| 2015/0050806 A1* | 2/2015 | Park .................. H01L 21/28562 438/643 |
| 2016/0133837 A1 | 5/2016 | Hsueh et al. |

* cited by examiner

METHOD OF FORMING A LAYER AND A METHOD OF FABRICATING A VARIABLE RESISTANCE MEMORY DEVICE USING THE SAME

CROSS-REFERENCE TO RELATED APPLICATIONS

This U.S. non-provisional patent application claims priority under 35 U.S.C. § 119 to Korean Patent Application No. 10-2017-0036231, filed on Mar. 22, 2017, in the Korean Intellectual Property Office, the entire contents of which are hereby incorporated by reference.

BACKGROUND OF THE INVENTION

The present disclosure relates to a method of forming a target layer in semiconductor fabrication and to a method of fabricating a variable resistance memory device using the same.

Semiconductor devices are generally classified into memory devices and logic devices. The memory devices for storing data are classified into volatile memory devices and nonvolatile memory devices. The volatile memory devices may lose their stored data when their power supplies are interrupted. The volatiles memory devices may, for example, include a dynamic random access memory (DRAM) and a static random access memory (SRAM). The nonvolatile memory devices may maintain their stored data even when their power supplies are interrupted and may, for instance, include a programmable read only memory (PROM), an erasable PROM (EPROM), an electrically EPROM (EEPROM), and a flash memory device.

In addition, to meet the recent demand for semiconductor memory devices with high performance and low power consumption, next-generation semiconductor memory devices have been developed. For example, a magnetic random access memory (MRAM), and a phase change random access memory (PRAM) are developed as candidates for the next-generation semiconductor memory devices. In the next-generation semiconductor memory devices, a material or structure whose resistance can be changed by a current or voltage forced thereto, and can be maintained even when a current or voltage supply is interrupted, is used as a memory element.

SUMMARY

Some embodiments of the inventive concept provide a method of forming a layer in semiconductor fabrication with desired characteristics through a low temperature process.

Some embodiments of the inventive concept provide a method of fabricating a variable resistance memory device with high reliability at an increased yield.

In one aspect, the present inventive concepts include a method of forming a target layer for a semiconductor device, comprising performing a unit process at least one time, wherein the unit process comprises: forming a first layer on a substrate by performing a first process at least one time; and forming a second layer on the first layer by performing a second process at least one time, wherein the first process includes the steps of: supplying a first source gas; supplying a second source gas several times; and supplying an inert gas several times.

In another aspect, the present inventive concepts include a method of fabricating a variable resistance memory device, comprising: forming a first conductive line on a substrate, the first conductive line extending in a first direction; forming a memory cell that is electrically connected to the first conductive line; and forming a second conductive line electrically connected to the memory cell, the second conductive line extending in a second direction that crosses the first direction, wherein the forming of the memory cell comprises: forming a switching device and a variable resistance structure that are connected in series between the first and second conductive lines; and forming an electrode pattern between the first and second conductive lines, the electrode pattern being electrically connected to the switching device and the variable resistance structure, wherein the forming of the electrode pattern comprises depositing an electrode layer at a temperature lower than a phase transition temperature of the switching device.

In still another aspect, the present inventive concepts include a method of forming a composite target layer on a semiconductor substrate wherein the target layer comprises components of two different layers that are sequentially deposited on the substrate, the method comprising the steps of: (a) forming a first layer on the substrate by performing a first layer formation process at least one time; (b) forming a second layer on the first layer by performing a second layer formation process at least one time; and, (c) forming the target layer having components of the first layer and of the second layer by repeating steps (a) and (b) sequentially multiple times. The step (a) of forming the first layer comprises the sequential steps of supplying a first source gas, supplying an inert gas to purge excess first source gas, supplying a second source gas several times, and supplying the inert gas several times to purge excess second source gas and/or reaction byproducts

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

FIGS. 16A to 19A are sectional views, which are provided to describe a method of fabricating a variable resistance memory device using a layer-forming method according to some embodiments of the inventive concept and are taken along a plane corresponding to line I-I' of FIG. 14.

FIGS. 16B to 19B are sectional views, which are provided to describe a method of fabricating a variable resistance memory device using a layer-forming method according to some embodiments of the inventive concept and are taken along a plane corresponding to line II-II' of FIG. 14.

FIGS. 22A to 25A are sectional views, which are provided to describe a method of fabricating a variable resistance memory device using a layer-forming method according to some embodiments of the inventive concept and are taken along a plane corresponding to line I-I' of FIG. 20.

FIGS. 22B to 25B are sectional views, which are provided to describe a method of fabricating a variable resistance memory device using a layer-forming method according to some embodiments of the inventive concept and are taken along a plane corresponding to line II-II' of FIG. 20.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary embodiments of the inventive concept will now be described more fully with reference to the accompanying drawings, in which exemplary embodiments are shown.

Figure 1:
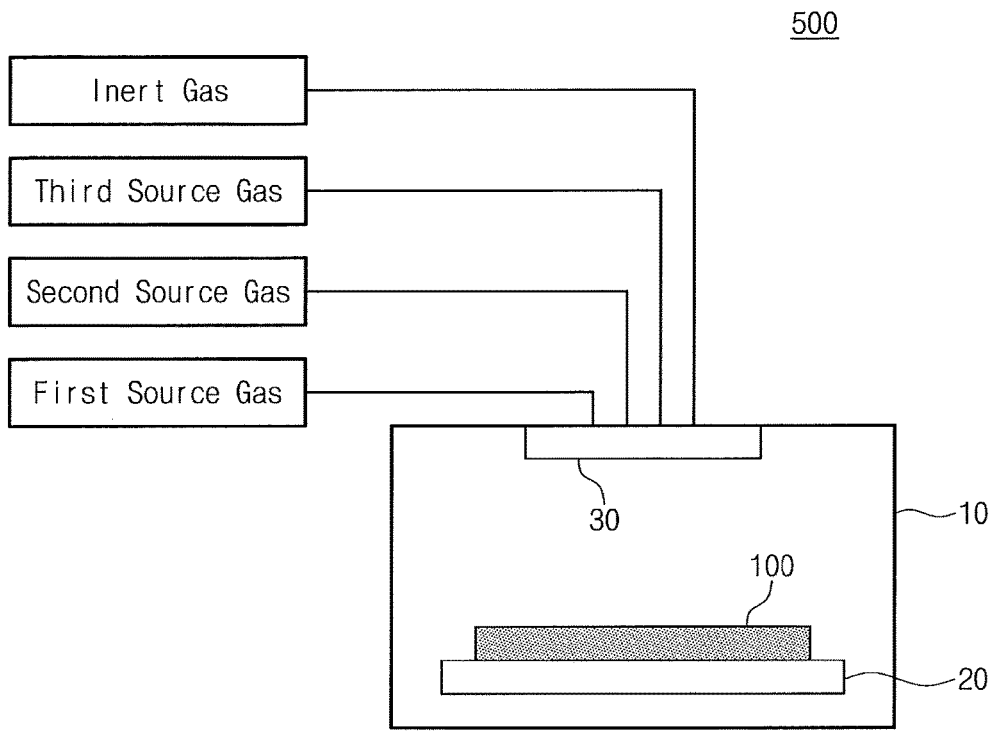
FIG. 1 is a schematic diagram of a deposition system to be used in a method of forming a layer, according to some embodiments of the inventive concept.
Figure 2:
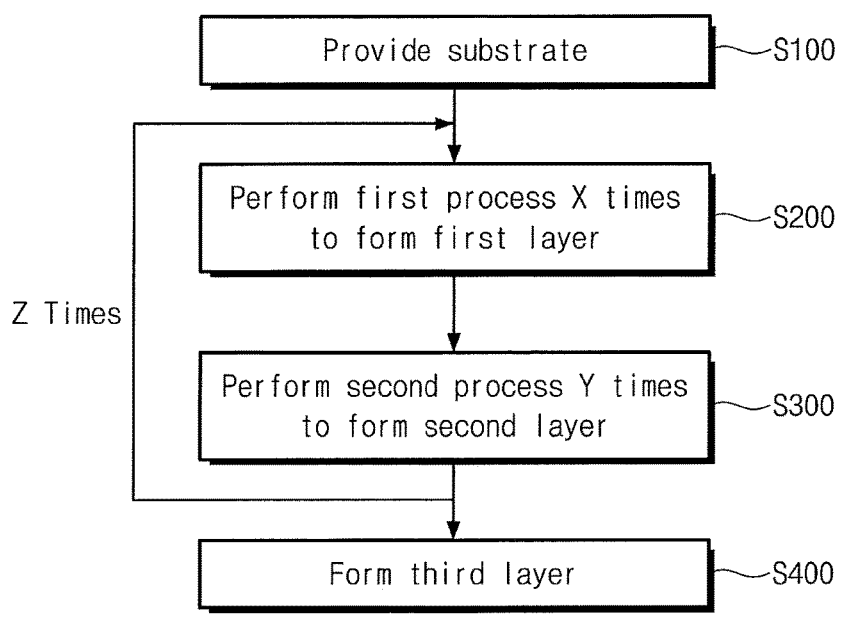
FIG. 2 is a flow chart illustrating a method of forming a layer, according to some embodiments of the inventive concept.

FIG. 1 is a schematic diagram of a deposition system to be used in a method of forming a layer, according to some embodiments of the inventive concept. FIG. 2 is a flow chart illustrating a method of forming a layer, according to some embodiments of the inventive concept, and FIG. 3 is a conceptual diagram illustrating a method of forming a layer, according to some embodiments of the inventive concept.

Referring to FIG. 1, a deposition system 500 may include a chamber 10, in which a layer-forming process is performed, a stage 20, which is placed in the chamber 10 and is used to load a substrate 100 thereon, and a shower head 30, which is used to supply reaction gases into the chamber 10. The shower head 30 may include a plurality of pathways, which are used to supply a first source gas, a second source gas, a third source gas, and an inert gas to the chamber 10. The first source gas, the second source gas, the third source gas, and the inert gas may be respectively or concurrently supplied into the chamber 10 through the shower head 30. In some embodiments, the deposition system may be a system that is configured to perform an atomic layer deposition process.

Figure 3:
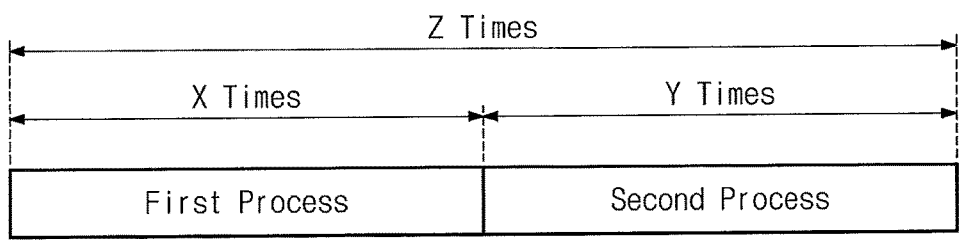
FIG. 3 is a conceptual diagram illustrating a method of forming a layer, according to some embodiments of the inventive concept.

Referring to FIGS. 1 to 3, the substrate 100 may be provided on the stage 20 of the deposition system 500 (in S100 of FIG. 2). A first process may be performed on the substrate 100, and here, the first process may be repeated X times to form a first layer on the substrate 100 (in S200 of FIG. 2). Here, X is an integer equal to or greater than 1. That is, the first layer may be formed by performing the first process on the substrate 100 at least one time. The first process may be performed using the first source gas, the second source gas, and the inert gas. In some embodiments, the first source gas may be a Ti-containing gas (e.g., $TiCl_4$), and the second source gas may be a N-containing gas (e.g., $NH_3$). The inert gas may contain argon. The first layer may be a TiN layer. The first process may be performed at a temperature lower than about 400° C. In some embodiments, the first process may be performed at a temperature that is equal to or higher than about 300° C. and is lower than about 400° C. The first process will be described in more detail below.

Figure 4:
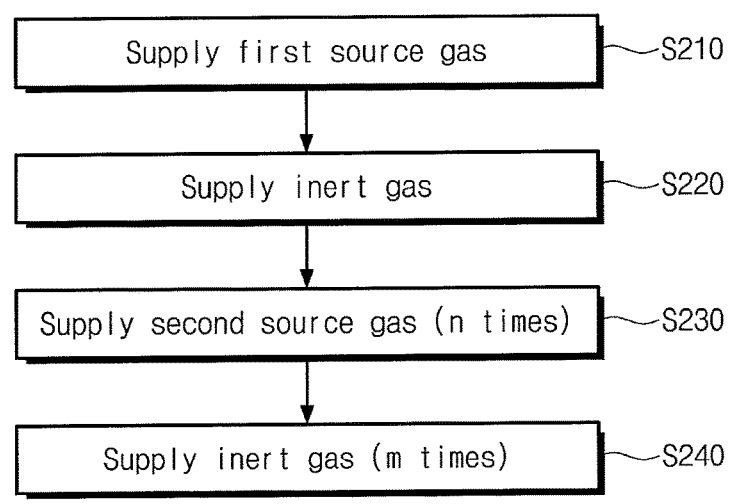
FIG. 4 is a flow chart illustrating an example of a first process in step S200 of FIG. 2.
Figure 5:
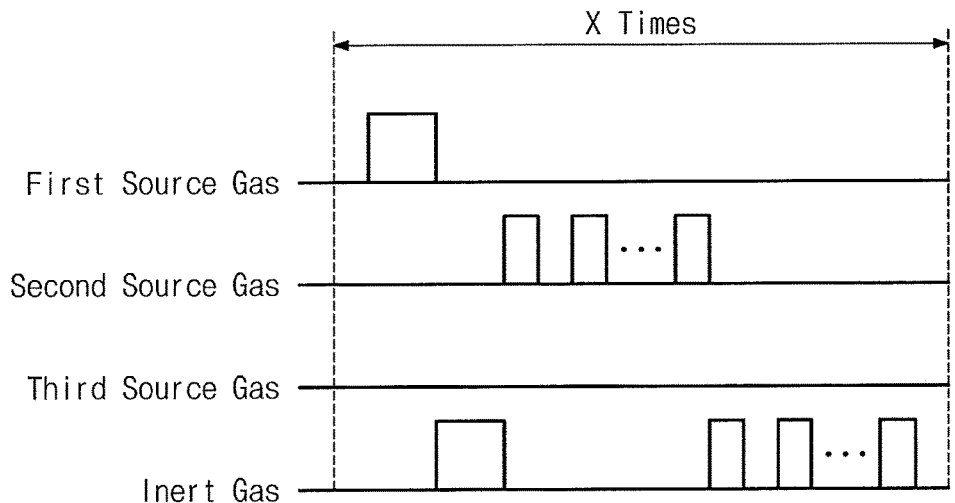
FIG. 5 is a conceptual diagram illustrating the first process of FIG. 4.

FIG. 4 is a flow chart illustrating an example of a first process in step S200 of FIG. 2, and FIG. 5 is a conceptual diagram illustrating the first process of FIG. 4.

Referring to FIGS. 4 and 5, the first source gas may be supplied onto the substrate 100 (in S210 of FIG. 4), and then the inert gas may be supplied onto the substrate 100 (in S220 of FIG. 4). The inert gas may be used to purge a chamber to which the first source gas was supplied in the preceding step. Thereafter, the second source gas may be supplied onto the substrate 100 n times (in S230 of FIG. 4). Here, n is an integer equal to or greater than 2. That is, the second source gas may be supplied several times. If the second source gas is supplied onto the substrate 100, the first source gas and the second source gas may be reacted with each other to form a reaction product (e.g., TiN) and a reaction by-product (e.g., HCl). In the case where the second source gas is supplied several times, the second source gas may be easily reacted with the first source gas. In some embodiments, the supplying of the second source gas may be performed n times, and then the step of supplying the inert gas may be performed m times (in S240 of FIG. 4). Here, m is an integer equal to or greater than 2. That is, after the step of supplying the second source gas is performed several times, the step of supplying the inert gas may be repeated several times. The step of supplying the inert gas may be performed to purge or remove from the chamber the reaction by-product, which is generated by the reaction between the first and second source gases. In the case where the inert gas is supplied several times, it may be possible to easily purge or remove the reaction by-product from the chamber.

Figure 6:
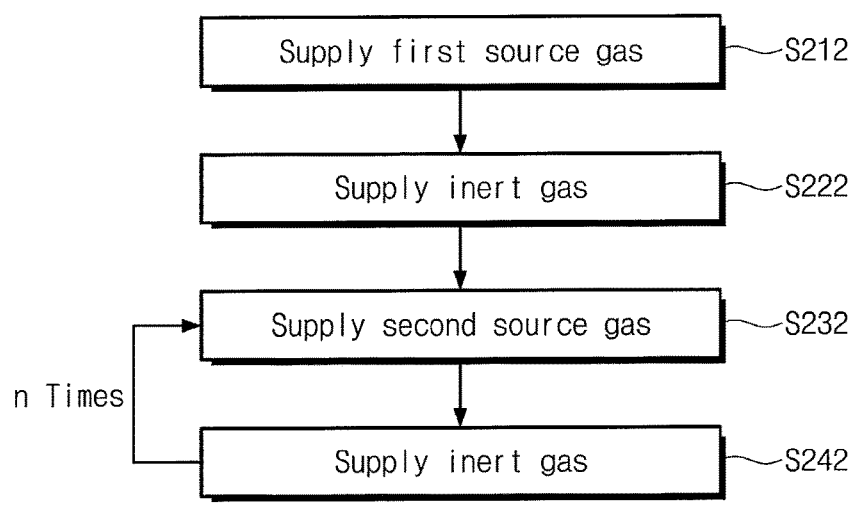
FIG. 6 is a flow chart illustrating another example of a first process in step S200 of FIG. 2.
Figure 7:
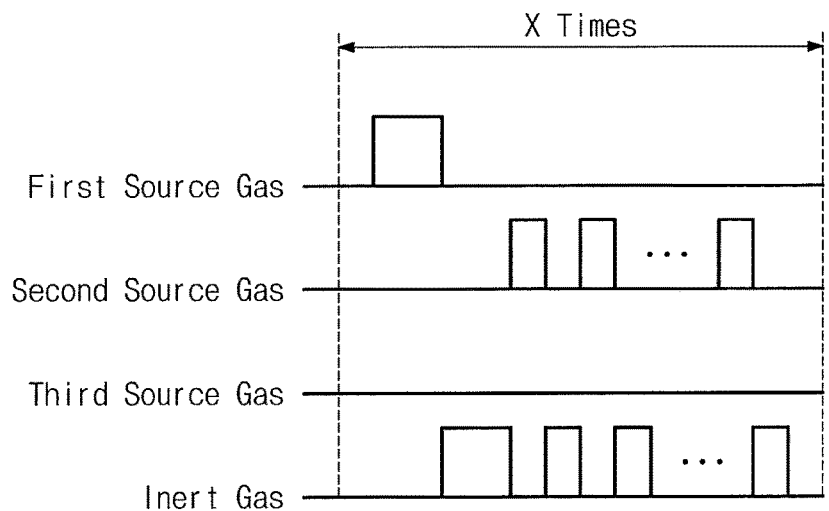
FIG. 7 is a conceptual diagram illustrating the first process of FIG. 6.

FIG. 6 is a flow chart illustrating another example of a first process in step S200 of FIG. 2, and FIG. 7 is a conceptual diagram illustrating the first process of FIG. 6.

Referring to FIGS. 6 and 7, the first source gas may be supplied onto the substrate 100 (in S212 of FIG. 6), and then, the inert gas may be supplied onto the substrate 100 (in S222 of FIG. 6). An over-supplied fraction of the first source gas may be purged or removed by the inert gas. Thereafter, the second source gas may be supplied onto the substrate 100 (in S232 of FIG. 6). If the second source gas is supplied onto the substrate 100, the first source gas and the second source gas may be reacted with each other, and thus, the reaction product (e.g., TiN) and the reaction by-product (e.g., HCl) may be formed. After the step of supplying the second source gas, the inert gas may be supplied to purge or remove the reaction by-product from the chamber (in S242 of FIG. 6). The step of supplying the second source gas and the step of supplying the inert gas may be repeated n times. Here, n is an integer equal to or greater than 2. That is, the second source gas may be supplied several times, and in this case, the second source gas and the inert gas may be alternately and repeatedly supplied onto the substrate 100. In the case where the second source gas and the inert gas are alternately and repeatedly supplied, the first and second source gases may be easily reacted with each other, and it may be possible to easily remove the reaction by-product which is produced by the reaction between the first and second source gases.

Referring back to FIGS. 1 to 3, in the case where the first process is performed at least one time, the reaction product may be deposited on the substrate 100, thereby forming the first layer. A second process may be performed on the substrate 100, and in some embodiments, the second process may be performed Y times to form a second layer on the substrate 100 (in S300 of FIG. 2). Here, Y is an integer equal to or greater than 1. The second layer may be formed by performing the second process on the substrate 100 at least one time. The second process may be performed using a third source gas, the second source gas, and the inert gas. As an example, the third source gas may be a Si-containing gas (e.g., dichlorosilane (DCS) or $SiH_4$), and the second source gas may be a N-containing gas (e.g., $NH_3$). The inert gas may contain argon. The second layer may be a SiN layer. The second process may be performed at a temperature lower than about 400° C. As an example, the second process may be performed at a temperature that is equal to or higher than about 300° C. and is lower than about 400° C. The second process will be described in more detail below.

Figure 8:
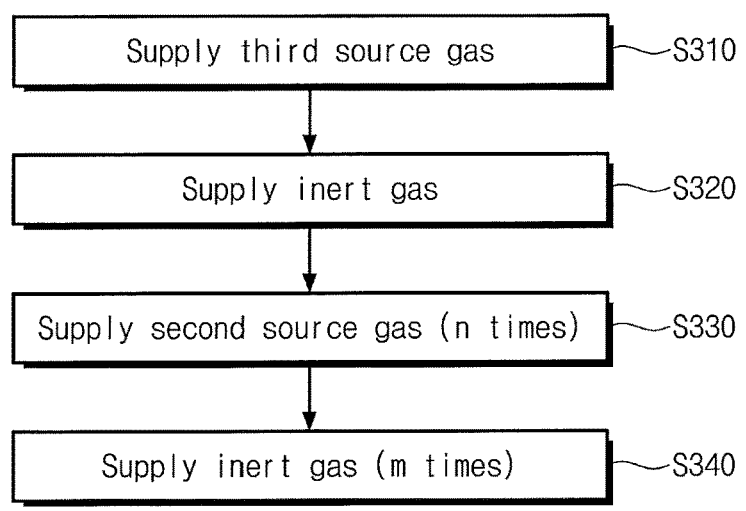
FIG. 8 is a flow chart illustrating an example of a second process in step S300 of FIG. 2.
Figure 9:
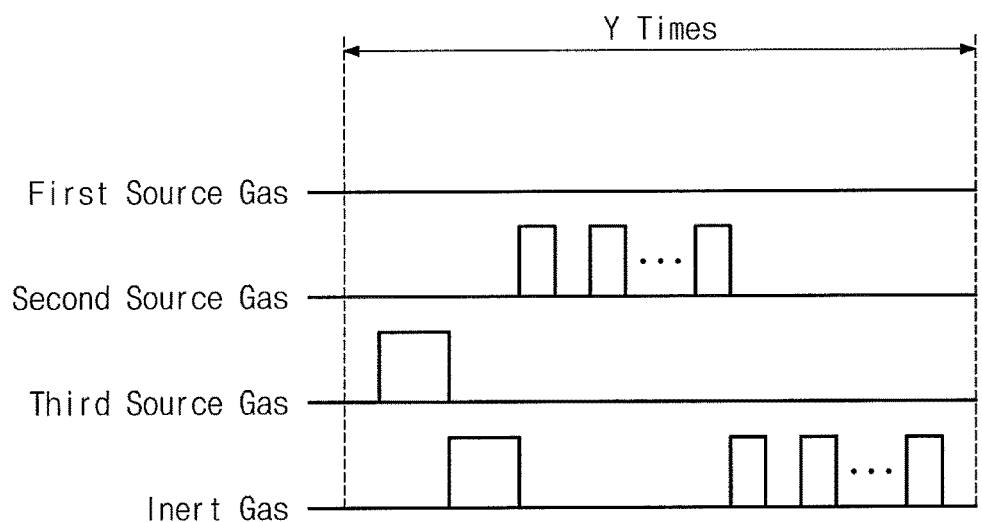
FIG. 9 is a conceptual diagram illustrating the second process of FIG. 8.

FIG. 8 is a flow chart illustrating an example of a second process in step S300 of FIG. 2, and FIG. 9 is a conceptual diagram illustrating the second process of FIG. 8.

Referring to FIGS. 8 and 9, the third source gas may be supplied onto the substrate 100 (in S310 of FIG. 8), and then the inert gas may be supplied onto the substrate 100 (in S320 of FIG. 8). An over-supplied fraction of the third source gas may be purged or removed by the inert gas. Thereafter, the second source gas may be supplied onto the substrate 100 n times (in S330 of FIG. 8). Here, n is an integer equal to or greater than 2. That is, the second source gas may be supplied several times. If the second source gas is supplied onto the substrate 100, the third source gas and the second source gas may be reacted with each other to form an additional reaction product (e.g., SiN) and an additional reaction by-product (e.g., HCl). In the case where the second source gas is supplied several times, the second source gas may be easily reacted with the third source gas. In some embodiments, the step of supplying the second source gas may be performed n times, and then the step of supplying the inert gas may be performed m times (in S340 of FIG. 8). Here, m is an integer equal to or greater than 2. That is, after the step of supplying the second source gas is performed several times, the step of supplying the inert gas may be repeated several times. The step of supplying the inert gas may be performed to purge the additional reaction by-product, which is generated by the reaction between the second and third source gases. In the case where the inert gas is supplied several times, it may be possible to easily purge or remove the additional reaction by-product.

Figure 10:
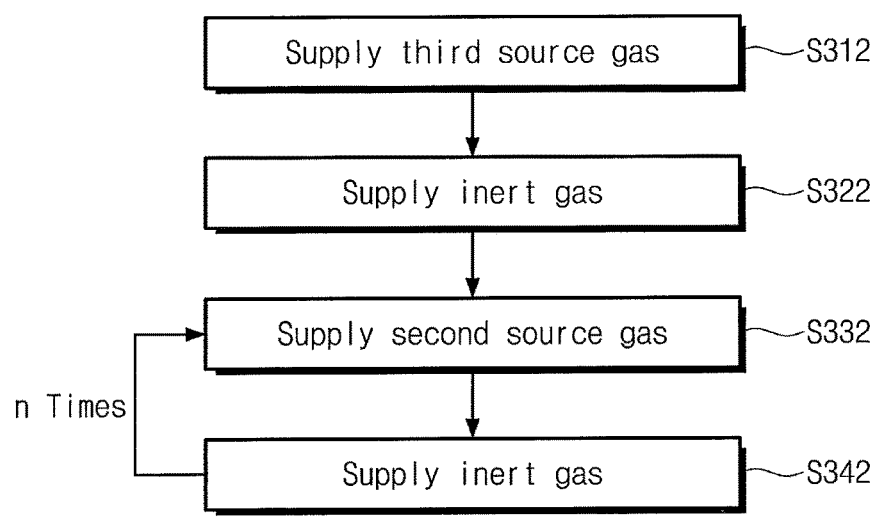
FIG. 10 is a flow chart illustrating another example of a second process in step S300 of FIG. 2.
Figure 11:
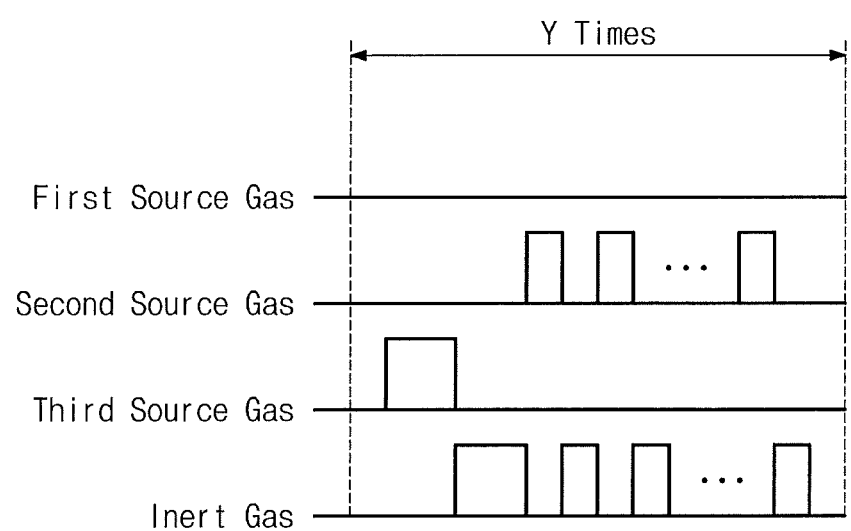
FIG. 11 is a conceptual diagram illustrating the second process of FIG. 10.

FIG. 10 is a flow chart illustrating another example of a second process in step S300 of FIG. 2, and FIG. 11 is a conceptual diagram illustrating the second process of FIG. 10.

Referring to FIGS. 10 and 11, the third source gas may be supplied onto the substrate 100 (in S312 of FIG. 10), and then, the inert gas may be supplied onto the substrate 100 (in S322 of FIG. 10). An over-supplied fraction of the third source gas may be purged or removed by the inert gas. Thereafter, the second source gas may be supplied onto the substrate 100 (in S332 of FIG. 10). If the second source gas is supplied onto the substrate 100, the third source gas and the second source gas may be reacted with each other to form an additional reaction product (e.g., SiN) and an additional reaction by-product (e.g., HCl). After the step of supplying the second source gas, the inert gas may be supplied to purge or remove the additional reaction by-product (in S342 of FIG. 10). The step of supplying the second source gas and the step of supplying the inert gas may be repeated n times. Here, n is an integer equal to or greater than 2. That is, the second source gas may be supplied several times, and, in this case, the second source gas and the inert gas may be alternately and repeatedly supplied onto the substrate 100. In the case where the second source gas and the inert gas are alternately and repeatedly supplied, the second and third source gases may be easily reacted with each other, and the reaction by-product, which is produced by the reaction between the second and third source gases, may be easily removed.

Referring back to FIGS. 1 to 3, in the case where the second process is performed at least one time, the additional reaction product may be deposited on the substrate 100 to form the second layer. A process including steps of forming the first layer and the second layer (in S200 and S300 of FIG. 2) may be repeated Z times, and, as a result, a third layer may be formed on the substrate 100 (in S400 of FIG. 2). Here, Z is an integer equal to or greater than 1. The third layer may be formed by repeating the process, including forming the first layer and the second layer, at least one time. The third layer may be, for example, a TiSiN layer.

In the case where the third layer (e.g., TiSiN layer) is formed at a low temperature lower than about 400° C., the content of chlorine (Cl) in the third layer may be increased. In this case, there may be a difficulty in forming the third layer with desired electric characteristics.

According to some embodiments of the inventive concept, each of the second source gas and the inert gas may be supplied several times during the first process and the second process. Since the second source gas is supplied several times, the second source gas may be easily reacted with the first source gas (or the third source gas). After or during the supplying of the second source gas several times, the inert gas may be supplied several times. Accordingly, a reaction by-product (e.g., HCl), which is produced by reaction between the first (or third) source gas and the second source gas, may be easily purged or removed by the inert gas. As a result, even if the first process and the second process are performed at a low temperature (e.g., lower than about 400° C.), it may be possible to reduce an amount of chlorine (Cl) that will be contained in the third layer. Thus, the third layer with desired electric characteristics may be easily formed by a low temperature process.

Figure 12:
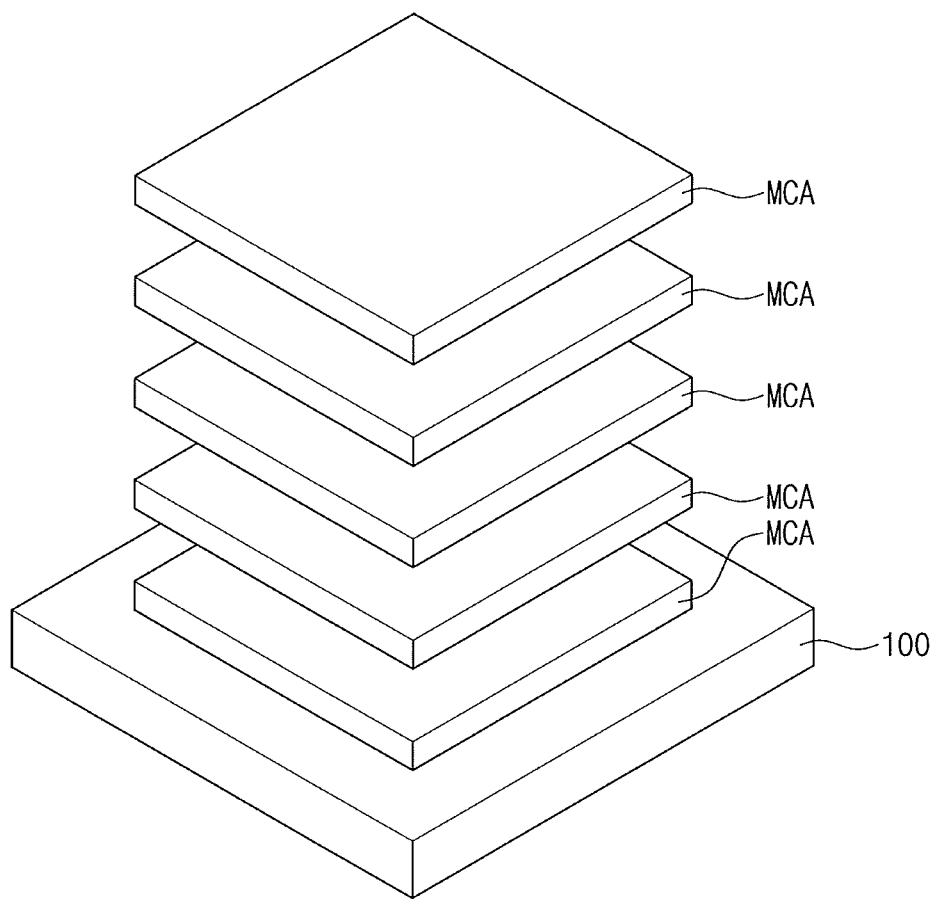
FIG. 12 is a conceptual diagram of a variable resistance memory device, which is fabricated by a layer-forming method according to some embodiments of the inventive concept.

FIG. 12 is a conceptual diagram of a variable resistance memory device, which is fabricated by a layer-forming method according to some embodiments of the inventive concept.

Referring to FIG. 12, a variable resistance memory device may include a plurality of memory cell stacks MCA that are sequentially stacked on a substrate 100. Each of the memory cell stacks MCA may include a plurality of memory cells that are two-dimensionally arranged. The variable resistance memory device may include a plurality of conductive lines that are provided between the memory cell stacks MCA and are used to perform write, read, and/or erase operations on the memory cells. Although five memory cell stacks MCA are illustrated in FIG. 12, the inventive concept is not limited thereto, i.e., fewer or more memory cell stacks may be provided.

Figure 13:
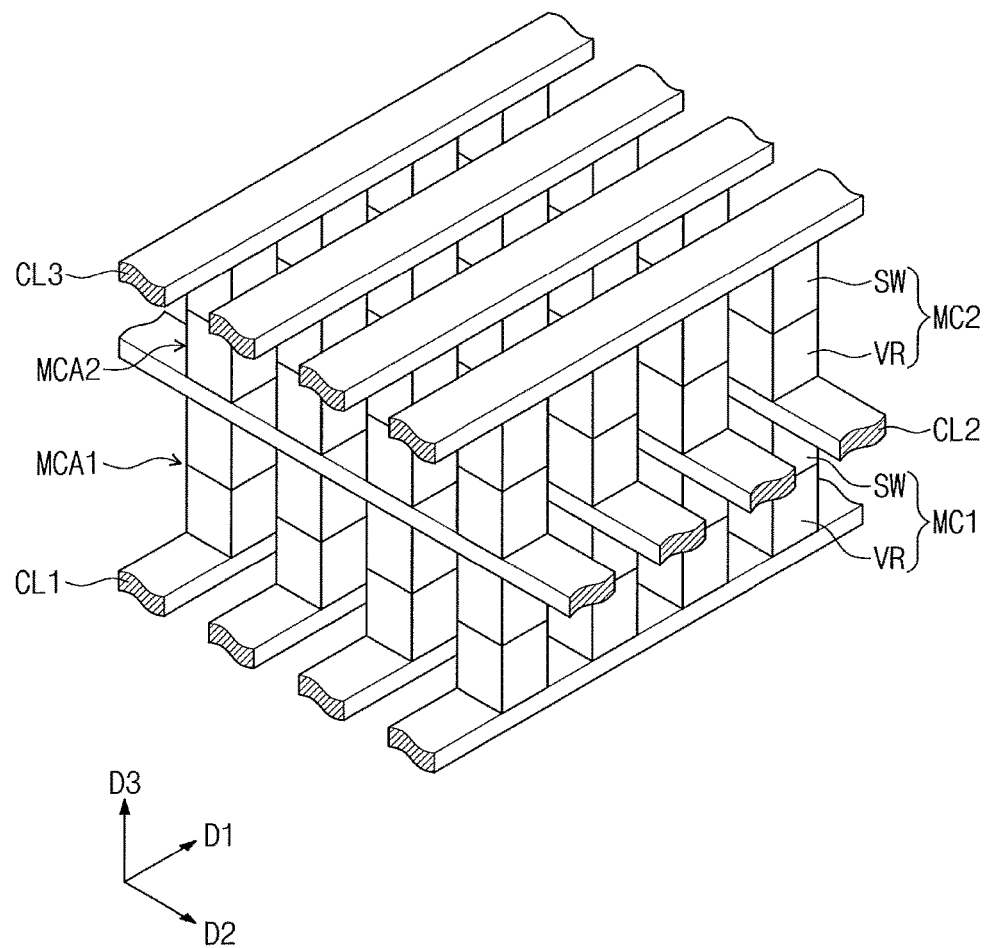
FIG. 13 is a perspective view schematically illustrating a variable resistance memory device, which is fabricated by a layer-forming method according to some embodiments of the inventive concept.

FIG. 13 is a perspective view schematically illustrating a variable resistance memory device which is fabricated by a layer-forming method according to some embodiments of the inventive concept. FIG. 13 illustrates an example in which two memory cell stacks MCA1 and MCA2 adjacent to each other are provided, but the inventive concept is not limited thereto, i.e., fewer or more memory cell stacks may be provided.

Referring to FIG. 13, first and third conductive lines CL1 and CL3, respectively, extending in a first direction D1 and second conductive lines CL2 extending in a second direction D2 may be provided, where the first and second directions D1 and D2 cross each other such that planes defined by D1 and D2 intersect each other. The first to third conductive lines CL1, CL2, and CL3 may be sequentially stacked and spaced apart from each other in a third direction D3 that is normal to the first and second directions D1 and D2.

A first memory cell stack MCA1 may be provided between the first and second conductive lines CL1 and CL2, and a second memory cell stack MCA2 may be provided between the second conductive lines CL2 and the third conductive lines CL3. The first memory cell stack MCA1 may include first memory cells MC1 which are arranged at respective intersections of the first and second conductive lines CL1 and CL2 in a plan view. As used here and hereinafter, the phrase "intersections of the first and second conductive lines CL1 and CL2" should be interpreted as a reference to one or more locations where the lines CL1 and CL2 would intersect if they were located in the same plane instead of being spaced from one another. The first memory cells MC1 may be two-dimensionally arranged in rows and columns. The second memory cell stack MCA2 may include second memory cells MC2 which are arranged at respective intersections of the second and third conductive lines CL2 and CL3 in a plan view. As used here and hereinafter, the phrase "intersections of the second and third conductive lines CL2 and CL3" should be interpreted as a reference to one or more locations where the lines CL2 and CL3 would intersect if they were located in the same plane instead of being spaced from one another. The second memory cells MC2 may be two-dimensionally arranged in rows and columns.

Each of the first and second memory cells MC1 and MC2 may include a variable resistance structure VR and a switching device SW. The variable resistance structure VR and the switching device SW may be connected in series between two corresponding conductive lines CL1, CL2, and CL3 (i.e., connected thereto). In some embodiments, the variable resistance structure VR and the switching device SW, which are included in each of the first memory cells MC1, may be connected in series between a corresponding one of the first conductive lines CL1 and a corresponding one of the second conductive lines CL2; and the variable resistance structure VR and the switching device SW, which are included in each of the second memory cells MC2, may be connected in series between a corresponding one of the second conductive lines CL2 and a corresponding one of the third conductive lines CL3. Although FIG. 13 illustrates an example in which the switching device SW is provided on (or above) and connected to the variable resistance structure VR, the inventive concept is not limited thereto. For example, unlike the illustration of FIG. 13, the variable resistance structure VR may be provided on (or above) and connected to the switching device SW.

Figure 14:
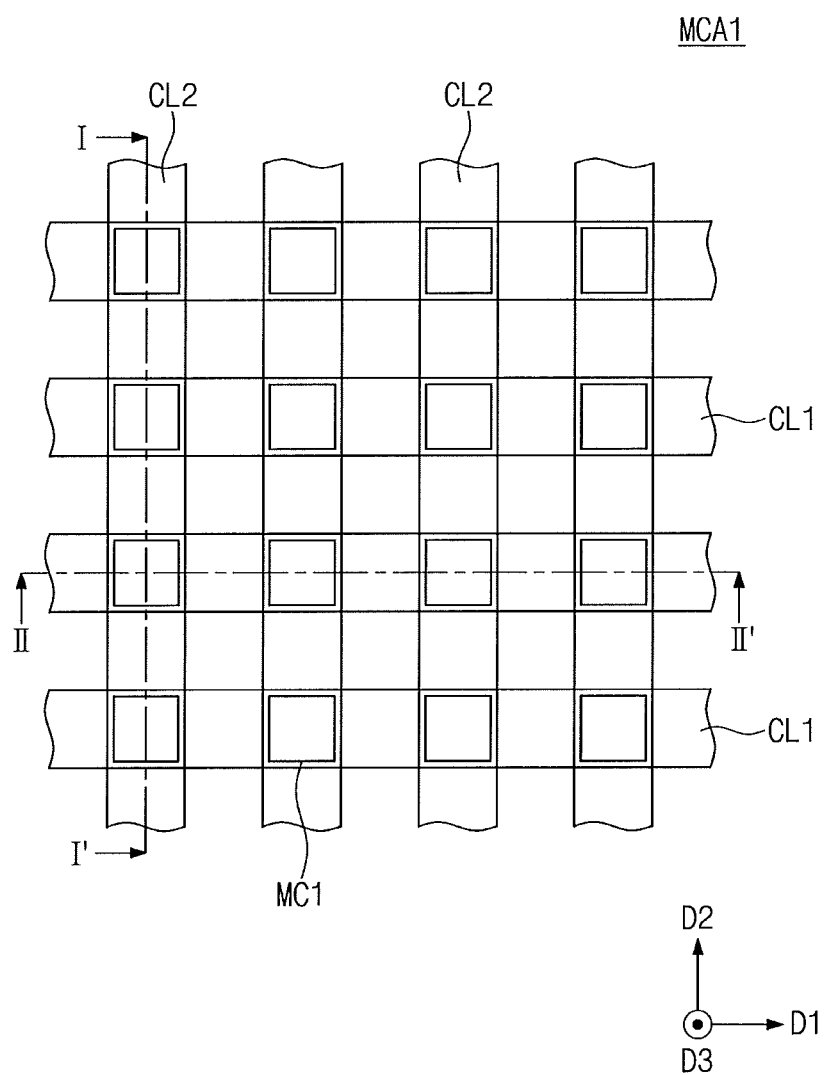
FIG. 14 is a plan view of a variable resistance memory device, which is fabricated by a layer-forming method according to some embodiments of the inventive concept.
Figure 15A:
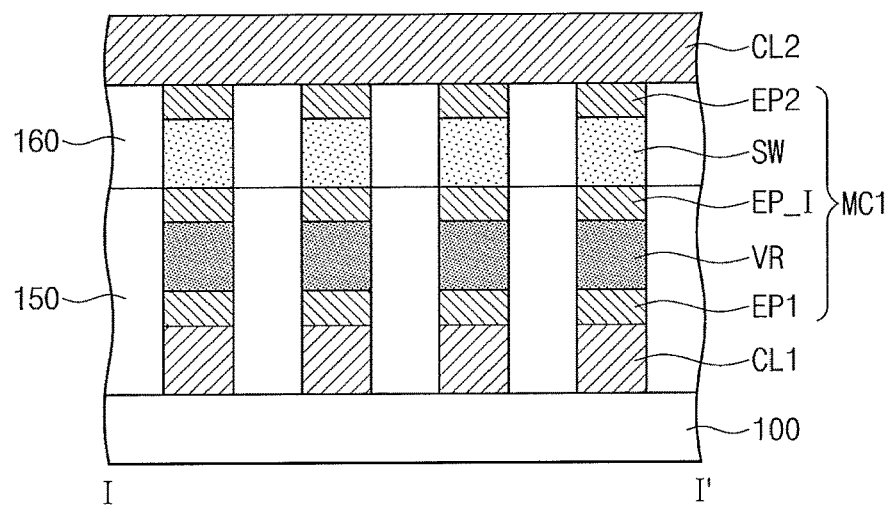
FIGS. 15A and 15B are sectional views taken along lines I-I' and II-II', respectively, of FIG. 14.
Figure 15B:
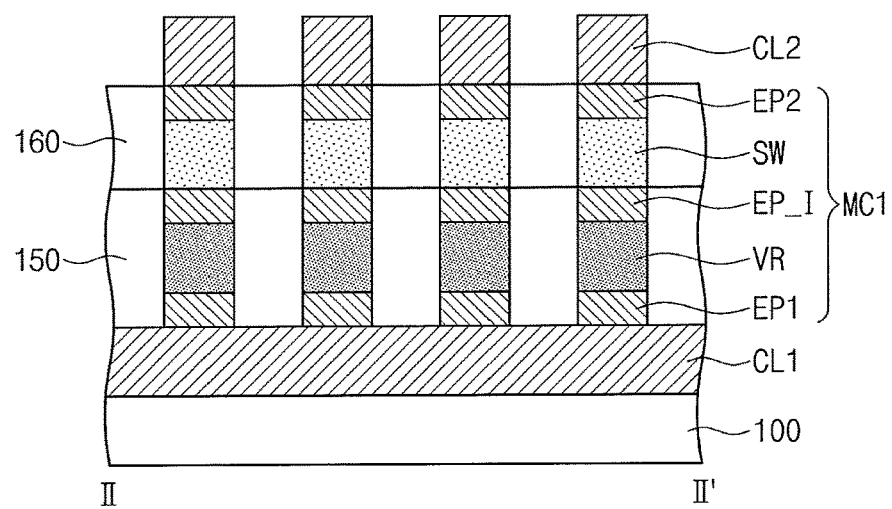

FIG. 14 is a plan view of a variable resistance memory device, which is fabricated by a layer-forming method according to some embodiments of the inventive concept. FIGS. 15A and 15B are sectional views taken along lines I-I' and II-II', respectively, of FIG. 14. For the sake of simplicity, the first memory cell stack MCA1 will be described as an example of a variable resistance memory device.

Referring to FIGS. 14, 15A, and 15B, first conductive lines CL1 and second conductive lines CL2 may be provided on a substrate 100. The first conductive lines CL1 may extend in the first direction D1 and may be spaced apart from each other in the second direction D2. The second conductive lines CL2 may be spaced apart from the first conductive lines CL1 in the third direction D3 that is perpendicular to the first and second directions D1 and D2. The second conductive lines CL2 may extend in the second direction D2 and may be spaced apart from each other in the first direction D1. The first conductive lines CL1 and the second conductive lines CL2 may be formed of or include at least one of metals (e.g., copper, tungsten, or aluminum) or metal nitrides (e.g., tantalum nitride, titanium nitride, or tungsten nitride).

First memory cells MC1 may be provided at respective intersections of the first and second conductive lines CL1 and CL2. The first memory cells MC1 may be two-dimensionally arranged in both of the first and second directions D1 and D2. The first memory cells MC1 may constitute a first memory cell stack MCA1. Although one memory cell stack MCA1 is illustrated to reduce complexity in the drawings, a plurality of memory cell stacks may be stacked on the substrate 100 in the third direction D3. In this case, structures corresponding to the first memory cell stack MCA1 and the first and second conductive lines CL1 and CL2 may be repeatedly stacked on the substrate 100.

Each of the first memory cells MC1 may include a variable resistance structure VR and a switching device SW, which are provided between a corresponding one of the first conductive lines CL1 and a corresponding one of the second conductive lines CL2 and are connected in series to the corresponding pair of the first and second conductive lines CL1 and CL2. As an example, the variable resistance structure VR may be an island-shaped structure that is locally provided at an intersection of the corresponding pair of the first and second conductive lines CL1 and CL2. As another example, although not illustrated, the variable resistance structure VR may be a line-shaped structure extending in the first or second direction D1 or D2. In this case, the variable resistance structure VR may be shared by a plurality of first memory cells MC1 that are arranged in the first or second direction D1 or D2. As an example, the switching device SW may be an island-shaped structure that is locally provided at an intersection of the corresponding pair of the first and second conductive lines CL1 and CL2. As another example, although not illustrated, the switching device SW may be a line-shaped structure extending in the first or second direction D1 or D2. In this case, the switching device SW may be shared by a plurality of first memory cells MC1 that are arranged in the first or second direction D1 or D2. The variable resistance structure VR may be provided between the substrate 100 and the switching device SW, but the inventive concept is not limited thereto. Unlike the configuration illustrated in the drawings, the switching device SW may be provided between the substrate 100 and the variable resistance structure VR.

The variable resistance structure VR may include a material having a variable resistance property. For example, the variable resistance structure VR may include a material whose phase is reversibly switched between crystalline and amorphous states depending on its temperature. As an example, a phase transition temperature of the variable resistance structure VR (e.g., from a crystalline state to an amorphous state or vice versa) may range from about 250° C. to about 350° C. In such embodiments, the variable resistance structure VR may include a compound, in which at least one of chalcogen elements (e.g., Te and Se) and at least one of Ge, Sb, Bi, Pb, Sn, Ag, As, S, Si, In, Ti, Ga, P, O, or C are contained. As an example, the variable resistance structure VR may include at least one of GeSbTe, GeTeAs, SbTeSe, GeTe, SbTe, SeTeSn, GeTeSe, SbSeBi, GeBiTe, GeTeTi, InSe, GaTeSe, or InSbTe. As another example, the variable resistance structure VR may have a superlattice structure, in which a Ge-containing layer (e.g., a GeTe layer) and a Ge-free layer (e.g., a SbTe layer) are repeatedly stacked.

In certain embodiments, the variable resistance structure VR may include at least one of perovskite compounds or conductive metal oxides. As an example, the variable resistance structure VR may be formed of or include at least one of niobium oxide, titanium oxide, nickel oxide, zirconium oxide, vanadium oxide, PCMO ((Pr, Ca)MnO$_3$), strontium-titanium oxide, barium-strontium-titanium oxide, strontium-zirconium oxide, barium-zirconium oxide, and barium-strontium-zirconium oxide. As another example, the variable resistance structure VR may be a double-layer structure including a conductive metal oxide layer and a tunnel insulating layer or a triple-layer structure including a first conductive metal oxide layer, a tunnel insulating layer, and a second conductive metal oxide layer. In this case, the tunnel insulating layer may be formed of or include aluminum oxide, hafnium oxide, or silicon oxide.

The switching device SW may be operated using a threshold switching phenomenon, and in some embodiments, it may be configured to exhibit a nonlinear electric current-voltage property (e.g., an 'S'-shaped I-V curve). As an example, the switching device SW may be a bi-directional Ovonic threshold switch (OTS) device. The switching device SW may have a phase transition temperature higher than that of the variable resistance structure VR. For example, the phase transition temperature of the switching device SW may range from about 350° C. to about 450° C. Accordingly, during an operation of a variable resistance memory device, it may be possible to reversibly change a phase of the variable resistance structure VR (e.g., from a crystalline state to an amorphous state or vice versa), without a substantial change in phase of the switching device SW (e.g., from the amorphous state). In the present specification, the term "amorphous state" include referring to an object in which there is a localized crystalline grain or portion.

The switching device SW may include a chalcogenide material and chemical impurities (i.e. dopants) therein. The chalcogenide material may include a compound in which at least one of chalcogen elements (e.g., Te and Se) and at least one of Ge, Sb, Bi, Al, Pb, Sn, Ag, As, S, Si, In, Ti, Ga or P are contained. As an example, the chalcogenide material may include at least one of AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, or GeAsBiSe. The chemical impurity (i.e. the dopant) may be at least one of C, N, B, or O.

Each of the first memory cells MC1 may further include an intermediate electrode EP_I interposed between the variable resistance structure VR and the switching device SW. The intermediate electrode EP_I may connect the variable resistance structure VR electrically with the switching device SW while also separating the variable resistance structure VR from direct physical contact with the switching device SW. The intermediate electrode EP_I may be formed of or include at least one of W, Ti, Al, Cu, C, CN, TiN, TiAlN, TiSiN, TiCN, WN, CoSiN, WSiN, TaN, TaCN, or TaSiN.

Each of the first memory cells MC1 may further include a first electrode EP1 provided between the variable resistance structure VR and a corresponding one of the first conductive lines CL1. The variable resistance structure VR may be electrically connected to the corresponding one of the first conductive lines CL1 via the first electrode EP1. The first electrode EP1 may be spaced apart from the intermediate electrode EP_I with the variable resistance structure VR interposed therebetween. The first electrode EP1 may be an island-shaped structure that is locally provided at an intersection of the corresponding pair of the first and second conductive lines CL1 and CL2. In some embodiments, a plurality of the first electrodes EP1 of the first memory cells MC1 may be provided at respective intersections of the first conductive lines CL1 and the second conductive lines CL2 and may be two-dimensionally arranged on the substrate 100. The first electrode EP1 may be a heater electrode, which is used to heat the variable resistance structure VR and to cause a change in phase of the variable resistance structure VR. The first electrode EP1 may be formed of or include a material whose resistivity is higher than those of the first and second conductive lines CL1 and CL2. The first electrode EP1 may include at least one of W, Ti, Al, Cu, C, CN, TiN, TiAlN, TiSiN, TiCN, WN, CoSiN, WSiN, TaN, TaCN, TaSiN, or TiO.

Each of the first memory cells MC1 may further include a second electrode EP2, which is provided between the switching device SW and a corresponding one of the second conductive lines CL2. The switching device SW may be electrically connected to the corresponding one of the second conductive lines CL2 via the second electrode EP2. The second electrode EP2 may be spaced apart from the intermediate electrode EP_I with the switching device SW interposed therebetween. The second electrode EP2 may be an island-shaped structure that is locally provided at an intersection of the corresponding pair of the first and second conductive lines CL1 and CL2. In some embodiments, a plurality of the second electrodes EP2 of the first memory cells MC1 may be provided at respective intersections of the first and second conductive lines CL1 and CL2 and may be two-dimensionally arranged on the substrate 100. In certain embodiments, unlike the illustrations in the drawings, the second electrode EP2 may be a line-shaped structure extending in an extension direction of the second conductive line CL2 (e.g., in the second direction D2). In this case, the second electrode EP2 may be shared by a plurality of first memory cells MC1, which are arranged in the extension direction of the second conductive line CL2 (e.g., in the second direction D2). The second electrode EP2 may include at least one of W, Ti, Al, Cu, C, CN, TiN, TiAlN, TiSiN, TiCN, WN, CoSiN, WSiN, TaN, TaCN, TaSiN, or TiO.

At least one of the first electrode EP1, the intermediate electrode EP_I, and the second electrode EP2 may include an electrode layer that is deposited using an atomic layer deposition method. The electrode layer may be deposited at a temperature that is lower than a phase transition temperature of the switching device SW. As an example, the electrode layer may be a TiSiN layer. The content of chlorin ($Cl_2$) in the electrode layer may be equal to or less than about 1%, and a measure of surface roughness (e.g., root mean square (RMS) surface roughness) of the electrode layer may range from about 1 nm to about 2 nm.

As seen in FIGS. 15A and 15B, a first interlayered insulating layer 150 may be provided on the substrate 100. The first interlayered insulating layer 150 may cover the first conductive lines CL1 and it also may cover the first electrode EP1, the variable resistance structure VR, and the intermediate electrode EP_I, which are included in each of the first memory cells MC1. As also seen in FIGS. 15A and 15B, a second interlayered insulating layer 160 may be provided on the first interlayered insulating layer 150. The second interlayered insulating layer 160 may be provided to cover the switching device SW and the second electrode EP2, which are also included in each of the first memory cells MC1. The second conductive lines CL2 may be provided on the second interlayered insulating layer 160. The first interlayered insulating layer 150 and the second interlayered insulating layer 160 may include at least one of silicon oxide, silicon nitride, or silicon oxynitride.

FIGS. 16A to 19A are sectional views, which are provided to describe a method of fabricating a variable resistance memory device using a layer-forming method according to some embodiments of the inventive concept. The sectional views of FIGS. 16A to 19A are taken along a plane corresponding to line I-I' of FIG. 14. FIGS. 16B to 19B are sectional views, which are provided to describe a method of fabricating a variable resistance memory device using a layer-forming method according to some embodiments of the inventive concept. The sectional views of FIGS. 16B to 19B are taken along a plane corresponding to line II-II' of FIG. 14. In the following description, an element previously described with reference to FIGS. 14, 15A, and 15B may be identified by a similar or identical reference number without repeating an overlapping description thereof, for the sake of brevity.

Figure 16A:
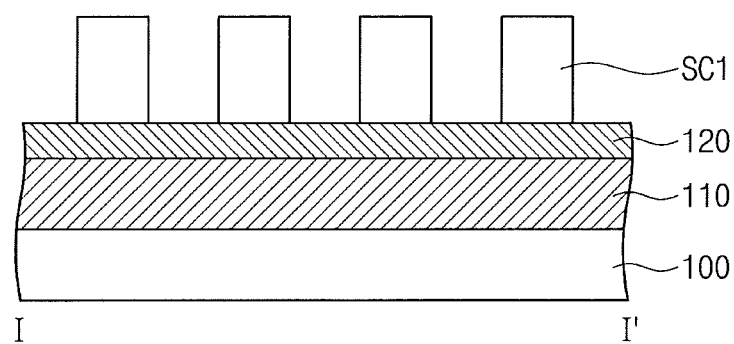
Figure 16B:
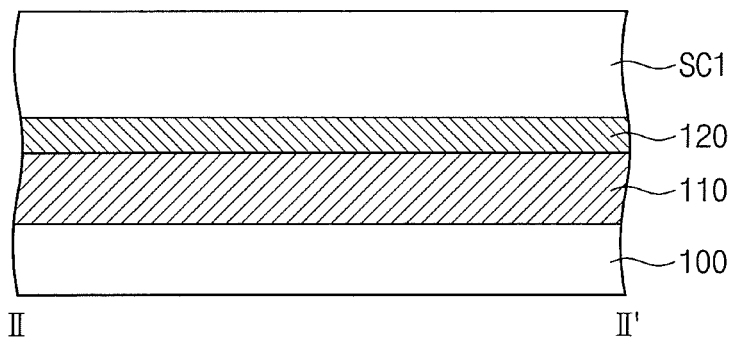

Referring to FIGS. 16A and 16B, a first conductive layer 110 and a first electrode layer 120 may be sequentially formed on a substrate 100. The first conductive layer 110 may be formed by a deposition process (e.g., a chemical vapor deposition or physical vapor deposition process). The first conductive layer 110 may be formed of or include at least one of metals (e.g., copper, tungsten, or aluminum) or metal nitrides (e.g., tantalum nitride, titanium nitride, or tungsten nitride).

The first electrode layer 120 may be formed using the layer-forming method described above with reference to FIGS. 1 to 11. For example, as described with reference to FIGS. 1 to 3, the substrate 100 with the first conductive layer 110 may be loaded on the stage 20 of the deposition system 500 (in FIG. 1 and in S100 of FIG. 2).

The first process may be performed at least one time to form a first layer on the substrate 100 (in S200 of FIG. 2). The first process may be performed using the first source gas, the second source gas, and the inert gas. In some embodiments, the first source gas may be a Ti-containing gas (e.g., $TiCl_4$), and the second source gas may be a N-containing gas (e.g., $NH_3$). The inert gas may contain, for example, argon. In some embodiments, as described with reference to FIGS. 4 and 5, the first process may include supplying the first source gas onto the substrate 100 (in S210 of FIG. 4), supplying the inert gas to purge or remove an over-supplied fraction of the first source gas (in S220 of FIG. 4), supplying the second source gas several times (in S230 of FIG. 4), and then, supplying the inert gas several times to purge or remove a reaction by-product (e.g., HCl) which may be generated by a chemical reaction of the first and second source gases (in S240 of FIG. 4). In certain embodiments, as described with reference to FIGS. 6 and 7, the first process may include supplying the first source gas onto the substrate 100 (in S212 of FIG. 6), supplying the inert gas onto the substrate 100 to purge or remove an over-supplied fraction of the first source gas (in S222 of FIG. 6), supplying the second source gas (in S232 of FIG. 6), and supplying the inert gas to purge or remove a reaction by-product (e.g., HCl) which may be generated by a chemical reaction of the first and second source gases (in S242 of FIG. 6). The process of sequentially supplying the second source gas and the inert gas (in S232 and S242) may be repeated several times. For example, the second source gas and the inert gas may be alternately and repeatedly supplied onto the substrate 100, while the second source gas is supplied several times. In the case where the first process is performed at least one time, the first layer may be formed on the substrate 100. As an example, the first layer may be a TiN layer.

The second process may be performed at least one time to form a second layer on the substrate 100 (in S300 of FIG. 2). The second process may be performed using the third source gas, the second source gas, and the inert gas. The third source gas may be a Si-containing gas (e.g., dichlorosilane (DCS) or $SiH_4$), and the second source gas may be a N-containing gas (e.g., $NH_3$). The inert gas may contain, for example, argon. In some embodiments, as described with reference to FIGS. 8 and 9, the second process may include supplying the third source gas onto the substrate 100 (in S310 of FIG. 8), supplying the inert gas to purge or remove an over-supplied fraction of the third source gas (in S320 of FIG. 8), supplying the second source gas several times (in S330 of FIG. 8), and then, supplying the inert gas several times to purge or remove a reaction by-product (e.g., HCl) which may be generated by a chemical reaction of the second and third source gases (in S340 of FIG. 8). In certain embodiments, as described with reference to FIGS. 10 and 11, the second process may include supplying the third source gas onto the substrate 100 (in S312 of FIG. 10), supplying the inert gas onto the substrate 100 to purge or remove an over-supplied fraction of the third source gas (in S322 of FIG. 10), supplying the second source gas onto the substrate 100 (in S332 of FIG. 10), and supplying the inert gas to purge or remove a reaction by-product (e.g., HCl), which may be generated by a chemical reaction of the second and third source gases (in S342 of FIG. 10). The process of sequentially supplying the second source gas and the inert gas (in S332 and S342) may be repeated several times. For example, the second source gas and the inert gas may be alternately and repeatedly supplied onto the substrate 100, while the second source gas is supplied several times. In the case where the second process is performed at least one time, the second layer may be formed on the substrate 100. As an example, the second layer may be a SiN layer.

A process including steps of forming the first layer and the second layer (in S200 and S300 of FIG. 2) may be performed at least one time to form a third layer on the substrate 100 (in S400 of FIG. 2). The third layer may correspond to the first electrode layer 120. As an example, the first electrode layer 120 may be formed of or include TiSiN.

The first electrode layer 120 may be formed using an atomic layer deposition method and may be deposited at a temperature that is lower than a phase transition temperature of a switching device to be described below. As an example, the first electrode layer 120 may be deposited at a temperature that is equal to or higher than about 300° C. and is lower than about 400° C. After the formation of the first electrode layer 120, the substrate 100 may be unloaded from the stage 20 of the deposition system 500 (FIG. 1).

Referring back to FIGS. 16A and 16B, first sacrificial patterns SC1 may be formed on the first electrode layer 120. As shown in FIGS. 16A and 16B, the first sacrificial patterns SC1 may extend in the first direction D1 and may be spaced apart from each other in the second direction D2. The first sacrificial patterns SC1 may be formed of or include a material that has an etch selectivity with respect to first and second insulating gap-fill layers, which will be described below.

Figure 17A:
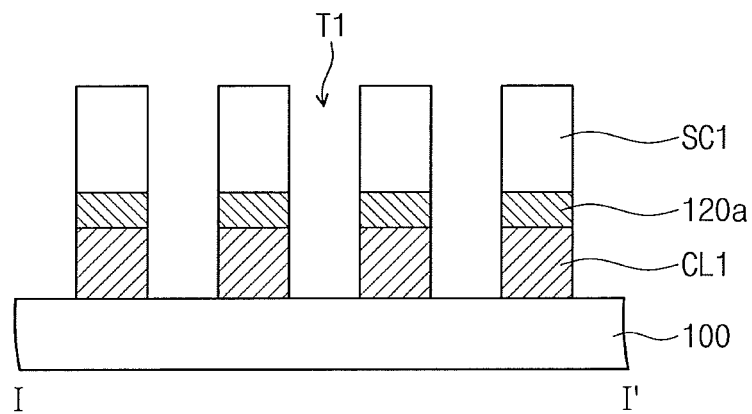
Figure 17B:
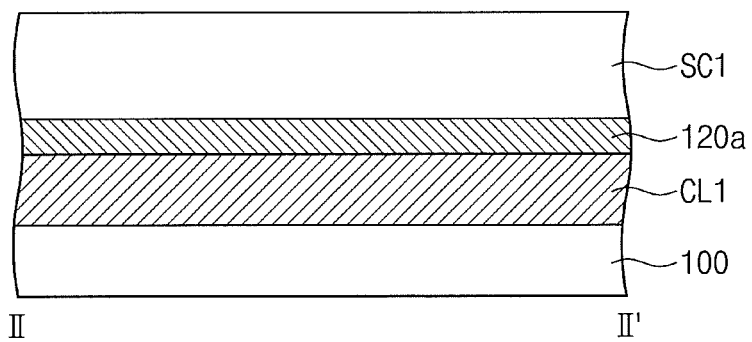

Referring to FIGS. 17A and 17B, the first electrode layer 120 of FIGS. 16A and 16B and the first conductive layer 110 of FIGS. 16A and 16B may be sequentially etched using the first sacrificial patterns SC1 as an etch mask. Thus, first trenches T1 may be formed to penetrate the first electrode layer 120 and the first conductive layer 110 and to extend in the first direction. The first conductive layer 110 may be etched to form first conductive lines CL1. The first conductive lines CL1 may extend in the first direction D1, and they may be spaced apart from each other in the second direction D2 by the first trenches T1. The first electrode layer 120 may be etched to form preliminary electrode patterns 120a. The preliminary electrode patterns 120a may extend in the first direction D1, and they may be spaced apart from each other in the second direction D2 by the first trenches T1.

Figure 18A:
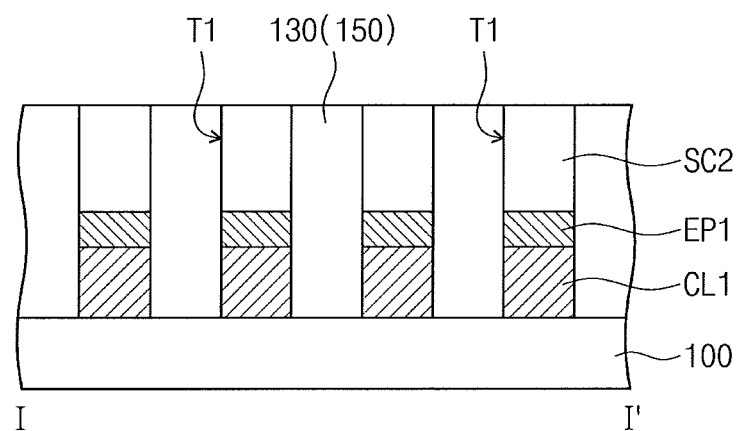
Figure 18B:
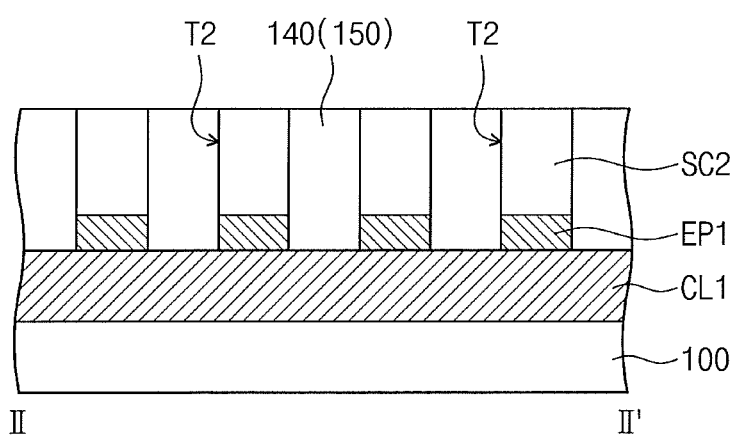

Referring to FIGS. 18A and 18B, a first insulating gap-fill layer 130 may be formed to fill the first trenches T1. The formation of the first insulating gap-fill layer 130 may include forming an insulating layer (not shown) to fill the first trenches T1 and performing a planarization process to expose the first sacrificial patterns SC1. The first insulating gap-fill layer 130 may be formed of or include at least one of silicon oxide, silicon nitride, or silicon oxynitride.

The first sacrificial patterns SC1 and the preliminary electrode patterns 120a may be patterned to form second sacrificial patterns SC2 and first electrodes EP1. The patterning process may include forming mask patterns (not shown) extending in the second direction D2, on the first insulating gap-fill layer 130 and the first sacrificial patterns SC1, and then, sequentially etching the first sacrificial patterns SC1 and the preliminary electrode patterns 120a using the mask patterns as an etch mask. As a result of the patterning process, second trenches T2 extending in the second direction D2 may be formed. In some embodiments, the second trenches T2 may be formed to expose top surfaces of the first conductive lines CL1. For example, as shown in FIG. 18B, bottom surfaces of the second trenches T2 may be substantially coplanar with the top surfaces of the first conductive lines CL1. In certain embodiments, the bottom surfaces of the second trenches T2 may be located at a level higher than the top surfaces of the first conductive lines CL1 when measured from the upper surface of substrate 100.

A second insulating gap-fill layer 140 may be formed to fill the second trenches T2. The formation of the second insulating gap-fill layer 140 may include forming an insulating layer (not shown) to fill the second trenches T2, and performing a planarization process to expose the second sacrificial patterns SC2. The second insulating gap-fill layer 140 may be formed of or include at least one of silicon oxide, silicon nitride, or silicon oxynitride. The first and second insulating gap-fill layers 130 and 140 may be used as a first interlayered insulating layer 150 (as shown in parentheses in FIGS. 8A and 8B).

Figure 19A:
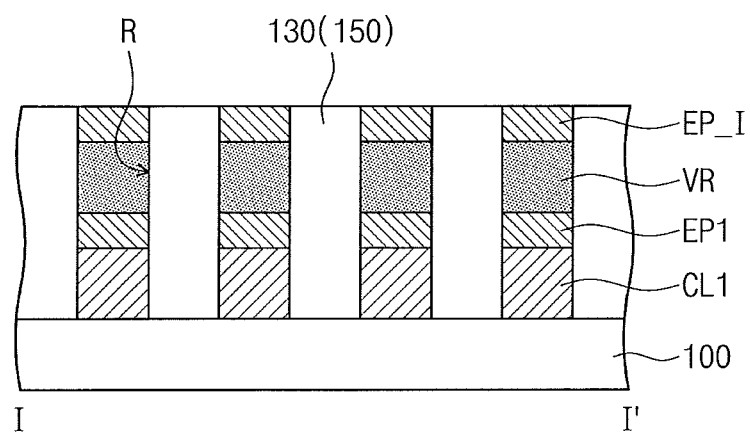
Figure 19B:
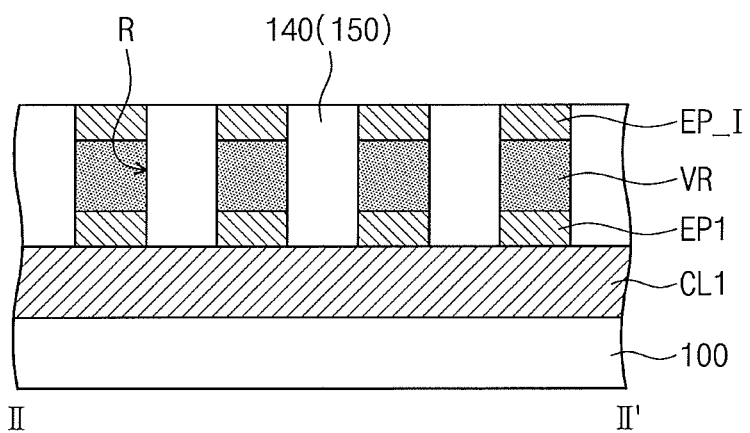

Referring to FIGS. 19A and 19B, the second sacrificial patterns SC2 may be selectively removed to form recess regions R in the first interlayered insulating layer 150. In some embodiments, the recess regions R may be spaced apart from each other in the first and second directions D1 and D2 respectively. In the case where the first interlayered insulating layer 150 includes a silicon nitride layer and/or a silicon oxynitride layer, and where the second sacrificial patterns SC2 include a silicon oxide layer, the selective removal of the second sacrificial patterns SC2 may be performed using an etching solution containing phosphoric acid. The recess regions R may be formed to expose top surfaces of the first electrodes EP1.

Variable resistance structures VR may be formed in the recess regions R, respectively. For example, the formation of the variable resistance structures VR may include forming a variable resistance layer (not shown) to fill the recess regions R and etching the variable resistance layer to locally form the variable resistance structures VR in the recess regions R. Each of the variable resistance structures VR may be formed to fill a portion (e.g., a lower portion) of a corresponding one of the recess regions R. A material to be used for the variable resistance structures VR may be the same as that described above with reference to FIGS. 14, 15A, and 15B.

Intermediate electrodes EP_I may be formed in the recess regions R, respectively. The intermediate electrodes EP_I may be formed on the variable resistance structures VR, respectively. Each of the intermediate electrodes EP_I may be formed to fill a remaining portion (e.g., an upper portion) of a corresponding one of the recess regions R. The formation of the intermediate electrodes EP_I may include forming an intermediate electrode layer on the first interlayered insulating layer 150 to fill the recess regions R, and then performing a planarization process to expose the first interlayered insulating layer 150. The intermediate electrode layer may be formed using the layer-forming method described above with reference to FIGS. 1 to 11. The intermediate electrode layer may be formed by substantially the same method as that used for forming the first electrode layer 120. The intermediate electrode layer may be formed using an atomic layer deposition method and may be deposited at a temperature lower than a phase transition temperature of a switching device to be described below. For example, the intermediate electrode layer may be deposited at a temperature that is equal to or higher than about 300° C. and is lower than about 400° C.

Referring back to FIGS. 15A and 15B, switching devices SW may be formed on the first interlayered insulating layer 150. The switching devices SW may be formed on the intermediate electrodes EP_I, respectively. Second electrodes EP2 may be formed on the switching devices SW, respectively. For example, the formation of the switching devices SW and the second electrodes EP2 may include forming a switching layer and a second electrode layer on the first interlayered insulating layer 150 and patterning the switching layer and the second electrode layer. A second interlayered insulating layer 160 may be formed on the first interlayered insulating layer 150 to cover the switching devices SW and the second electrodes EP2. In certain embodiments, the formation of the switching devices SW and the second electrodes EP2 may include: forming the second interlayered insulating layer 160 on the first interlayered insulating layer 150 to define holes exposing the intermediate electrodes EP_I respectively; forming a switching layer to fill the holes; etching the switching layer to form the switching devices SW in the holes, respectively; forming a second electrode layer on the second interlayered insulating layer 160 to fill the holes, and performing a planarization process to expose the second interlayered insulating layer 160; and forming each of the switching devices SW to fill a portion of a corresponding one of the holes. A material for the switching devices SW may be the same as that described above with reference to FIGS. 14, 15A, and 15B. The second electrode layer may be formed using the layer-forming method described above with reference to FIGS. 1 to 11. The second electrode layer may be formed by substantially the same method as that for the first electrode layer 120. The second electrode layer may be formed by an atomic layer deposition process, which may be performed at a temperature lower than a phase transition temperature of the switching device SW. For example, the second electrode layer may be deposited at a temperature that is equal to or higher than about 300° C. and is lower than about 400° C.

Second conductive lines CL2 may be formed on the second interlayered insulating layer 160. The second conductive lines CL2 may be formed by substantially the same method as that for the first conductive lines CL1. The second conductive lines CL2 may extend in the second direction D2 and may be formed to be spaced apart from each other in the first direction D1.

Referring back to FIGS. 14, 15A, and 15B, first memory cells MC1 may be defined at respective intersections of the first and second conductive lines CL1 and CL2. Each of the first memory cells MC1 may include the first electrode EP1, the variable resistance structure VR, the intermediate electrode EP_I, the switching device SW, and the second electrode EP2, which are provided between a corresponding one of the first conductive lines CL1 and a corresponding one of the second conductive lines CL2. The first memory cells MC1 may constitute a first memory cell stack MCA1.

In the case where the variable resistance memory device includes a plurality of memory cell stacks, the process for forming the first and second conductive lines CL1 and CL2 and the first memory cell stack MCA1 may be repeated.

In the case where at least one of the first electrode EP1, the intermediate electrode EP_I, and the second electrode EP2 is formed using an electrode layer that is deposited at a temperature higher than a phase transition temperature of the switching device SW, a phase of the switching device SW may be unintentionally and undesirably changed to a crystalline state during the process of depositing the electrode layer. As a result, there may be a failure of the switching device SW. In the case where the electrode layer (e.g., a TiSiN layer) is deposited at a relatively low temperature, a content of chlorine (Cl) in the electrode layer may be increased. In the case where the electrode layer is adjacent to the variable resistance structure VR, the chlorine (Cl) in the electrode layer may lead to a failure (e.g., void) of the variable resistance structure VR. Accordingly, it may be difficult to improve a yield and reliability of the variable resistance memory device.

By contrast, according to some embodiments of the inventive concept, at least one of the first electrode EP1, the intermediate electrode EP_I, and the second electrode EP2 may be formed using an electrode layer that is deposited at a temperature lower than a phase transition temperature of the switching device SW. Accordingly, during the process of depositing the electrode layer, the switching device SW adjacent to the electrode layer may be maintained in the amorphous state without any change in phase. Furthermore, in the case where the electrode layer (e.g., a TiSiN layer) is formed by a deposition process including the first process and the second process, it may be possible to reduce or minimize a content of chlorine (Cl) in the electrode layer, even if the electrode layer is deposited at a relatively low temperature. Thus, it may be possible to improve a yield and reliability of the variable resistance memory device.

Figure 20:
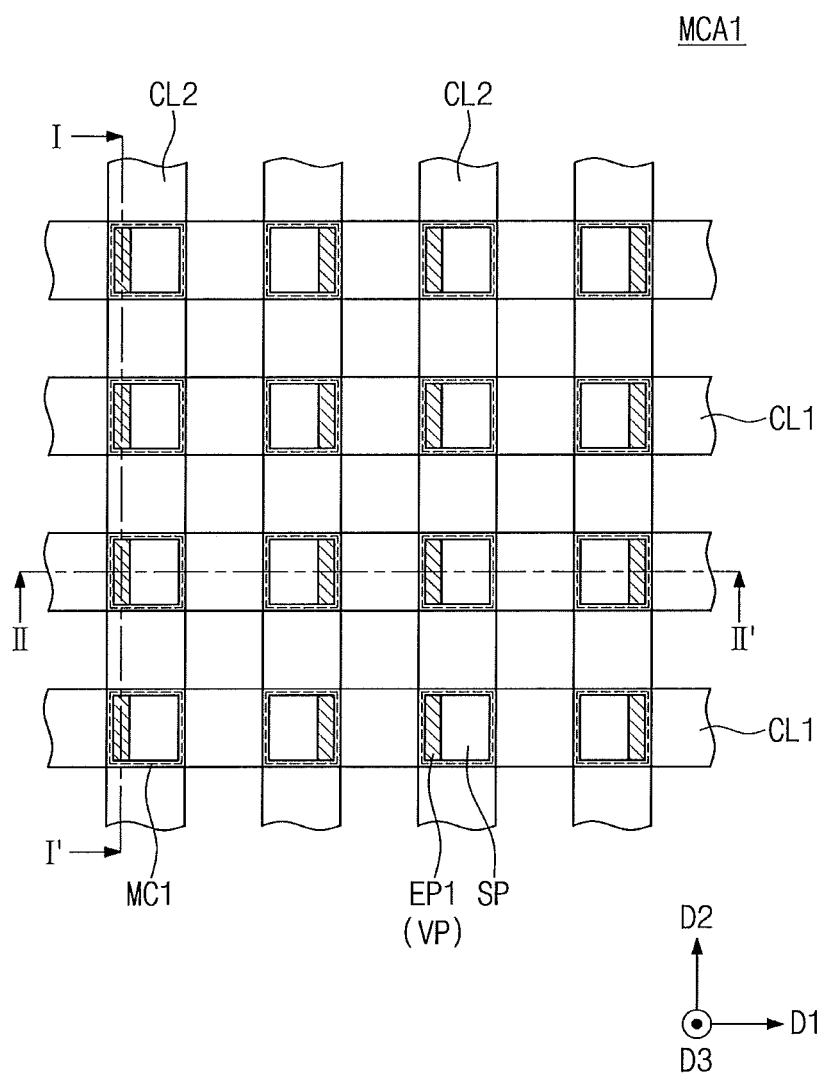
FIG. 20 is a plan view of a variable resistance memory device, which is fabricated by a layer-forming method according to some embodiments of the inventive concept.
Figure 21A:
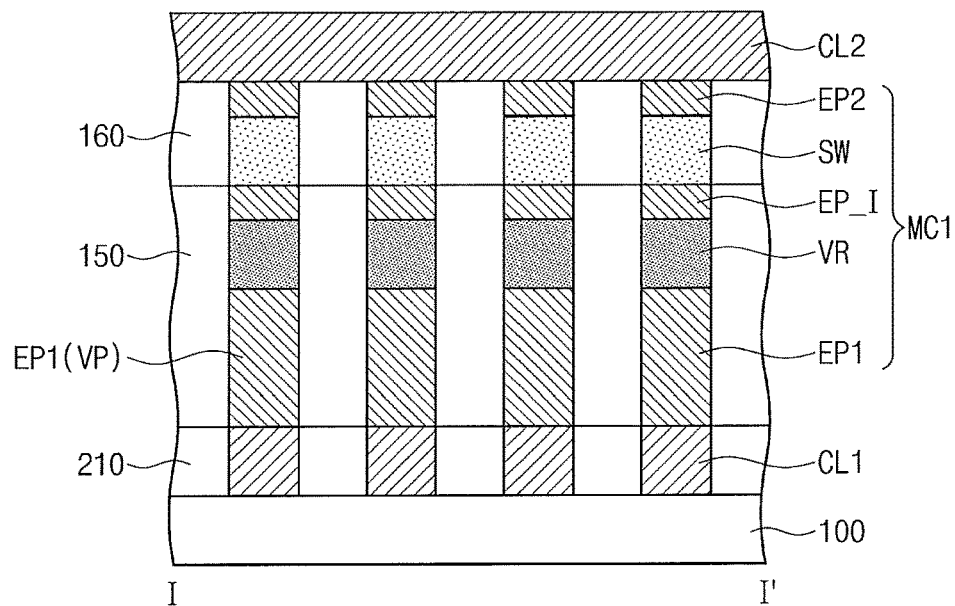
FIGS. 21A and 21B are sectional views taken along lines I-I' and II-II', respectively, of FIG. 20.
Figure 21B:
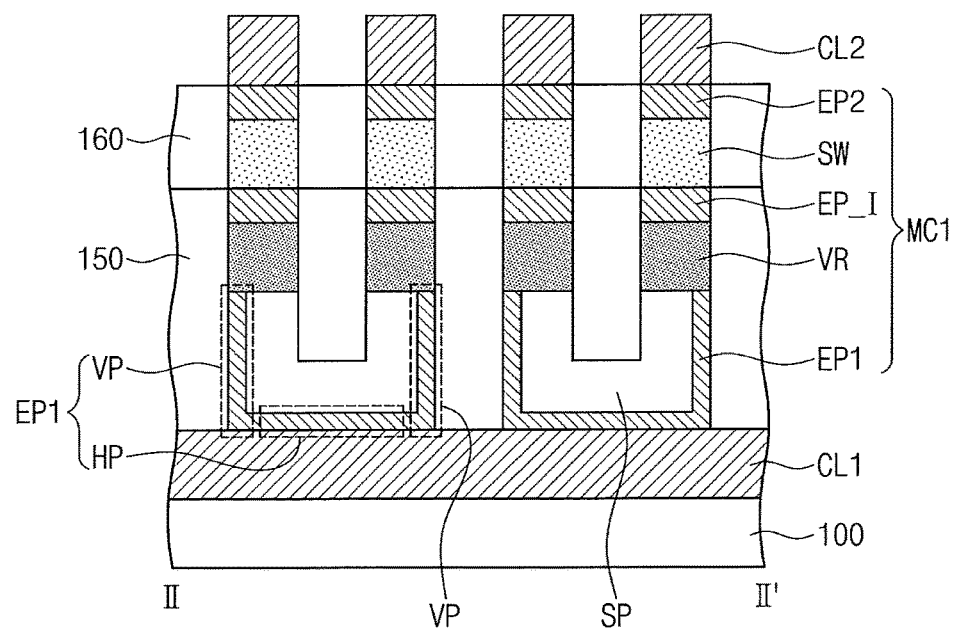

FIG. 20 is a plan view of a variable resistance memory device, which is fabricated by a layer-forming method according to some embodiments of the inventive concept. FIGS. 21A and 21B are sectional views taken along lines I-I' and II-II', respectively, of FIG. 20. For the sake of simplicity, a first memory cell stack MCA1 will be described as an example of a variable resistance memory device, and the description that follows will refer to technical features different from those of FIGS. 14, 15A, and 15B.

Referring to FIGS. 20, 21A, and 21B, first conductive lines CL1 and second conductive lines CL2 may be provided on a substrate 100. The first conductive lines CL1 may extend in the first direction D1 and may be spaced apart from each other in the second direction D2. The second conductive lines CL2 may be spaced apart from the first conductive lines CL1 in the third direction D3. The second conductive lines CL2 may extend in the second direction D2 and may be spaced apart from each other in the first direction D1.

First memory cells MC1 may be provided at respective intersections of the first and second conductive lines CL1 and CL2. The first memory cells MC1 may be two-dimensionally arranged in both of the first and second directions D1 and D2. The first memory cells MC1 may constitute a first memory cell stack MCA1 (FIG. 20). Each of the first memory cells MC1 may include a variable resistance structure VR and a switching device SW, which are provided between and connected in series to a corresponding pair of the first and second conductive lines CL1 and CL2. The variable resistance structure VR may include a material having a variable resistance property. For example, the variable resistance structure VR may include a material whose phase is reversibly switched between crystalline and amorphous states depending on its temperature. As an example, a phase transition temperature of the variable resistance structure VR (e.g., from a crystalline state to an amorphous state or vice versa) may range from about 250° C. to about 350° C. The switching device SW may be operated using a threshold switching phenomenon, and in some embodiments, it may be configured to exhibit a nonlinear electric current-voltage property (e.g., an 'S'-shaped I-V curve). As an example, the switching device SW may be a bi-directional Ovonic threshold switch (OTS) device. The switching device SW may have a phase transition temperature higher than that of the variable resistance structure VR. For example, the phase transition temperature of the switching device SW may range from about 350° C. to about 450° C. Accordingly, during an operation of a variable resistance memory device, it may be possible to reversibly change a phase of the variable resistance structure VR (e.g., from crystalline to amorphous state or vice versa), without a change in phase of the switching device SW (e.g., from the amorphous state). Each of the first memory cells MC1 may further include an intermediate electrode EP_I interposed between the variable resistance structure VR and the switching device SW. The intermediate electrode EP_I may be used to electrically connect the variable resistance structure VR to the switching device SW.

Each of the first memory cells MC1 may further include a first electrode EP1 provided between the variable resistance structure VR and a corresponding one of the first conductive lines CL1. The variable resistance structure VR may be electrically connected to the corresponding one of the first conductive lines CL1 via the first electrode EP1. According to the present embodiment, the first electrodes EP1 of each pair of the first memory cells MC1, which are arranged adjacent to each other in the first direction D1, may be connected to each other. In other words, as see in FIG. 21B, each pair of the first memory cells MC1 may share one first electrode EP1. In this case, the first electrode EP1 may include a pair of vertical portions VP, which are respectively connected to the variable resistance structures VR of a pair of the first memory cells MC1; and the first electrode EP1 may also include a horizontal portion HP, which is provided between the pair of the first memory cells MC1 and extends parallel to the substrate 100. The horizontal portion HP of the first electrode EP1 may extend along a top surface of a corresponding first conductive line CL1, which is connected in common to the pair of the first memory cells MC1. The first electrode EP1 may have a 'U'-shaped configuration as shown in FIG. 21B.

A spacer SP may be provided between the vertical portions VP of the first electrode EP1. The spacer SP may be provided on opposite sidewalls of the vertical portions VP and may extend along a top surface of the horizontal portion HP. The spacer SP may also have a 'U'-shaped configuration as shown in FIG. 21B. The horizontal portion HP of the first electrode EP1 may be interposed between the spacer SP and the top surface of the corresponding first conductive line CL1, which is connected in common to the pair of the first memory cells MC1. The spacer SP may be formed of or include poly silicon or silicon oxide.

Each of the first memory cells MC1 may further include a second electrode EP2, which is provided between the switching device SW and a corresponding one of the second conductive lines CL2. The switching device SW may be electrically connected to the corresponding one of the second conductive lines CL2 through the second electrode EP2.

At least one of the first electrode EP1, the intermediate electrode EP_I, and the second electrode EP2 may include an electrode layer that is deposited using an atomic layer deposition method. The electrode layer may be deposited at a temperature that is lower than a phase transition temperature of the switching device SW. As an example, the electrode layer may be a TiSiN layer. The content of $Cl_2$ in the electrode layer may be equal to or less than about 1%, and surface roughness (e.g., root mean square (RMS) surface roughness) of the electrode layer may range from about 1 nm to about 2 nm.

As further seen in FIGS. 21A and 21B, a first interlayered insulating layer 150 may be provided on the substrate 100. The first interlayered insulating layer 150 may be provided to cover the first electrode EP1, the variable resistance structure VR, and the intermediate electrode EP_I, which are included in each of the first memory cells MC1, and to cover the spacer SP. A second interlayered insulating layer 160 may be provided on the first interlayered insulating layer 150. The second interlayered insulating layer 160 may be provided to cover the switching device SW and the second electrode EP2, which are included in each of the first memory cells MC1. The second conductive lines CL2 may be provided on the second interlayered insulating layer 160. A third interlayered insulating layer 210 (FIG. 21A) may be provided between the substrate 100 and the first interlayered insulating layer 150 to cover the first conductive lines CL1. The first interlayered insulating layer 150, the second interlayered insulating layer 160, and the third interlayered insulating layer 210 may be formed of or include at least one of silicon oxide, silicon nitride, and/or silicon oxynitride.

FIGS. 22A to 25A are sectional views, which are provided to describe a method of fabricating a variable resistance memory device using a layer-forming method according to some embodiments of the inventive concept. The sectional views of FIGS. 22A to 25A are taken along a plane corresponding to line I-I' of FIG. 20. FIGS. 22B to 25B are sectional views, which are provided to describe a method of fabricating a variable resistance memory device using a layer-forming method according to some embodiments of the inventive concept. The sectional views of FIGS. 22B to 25B are taken along a plane corresponding to line of FIG. 20. In the following description, an element previously described with reference to FIGS. 20, 21A, and 21B may be identified by a similar or identical reference number without repeating an overlapping description thereof, for the sake of brevity. In particular, technical features different from the method illustrated in FIGS. 16A to 19A and 16B to 19B will be mainly described below.

Figure 22A:
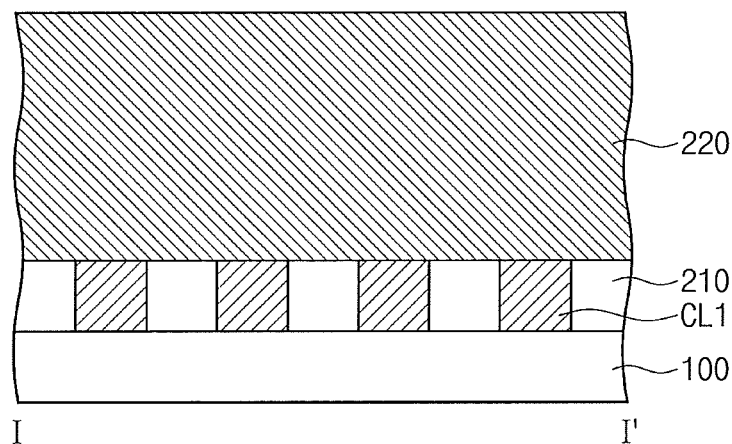
Figure 22B:
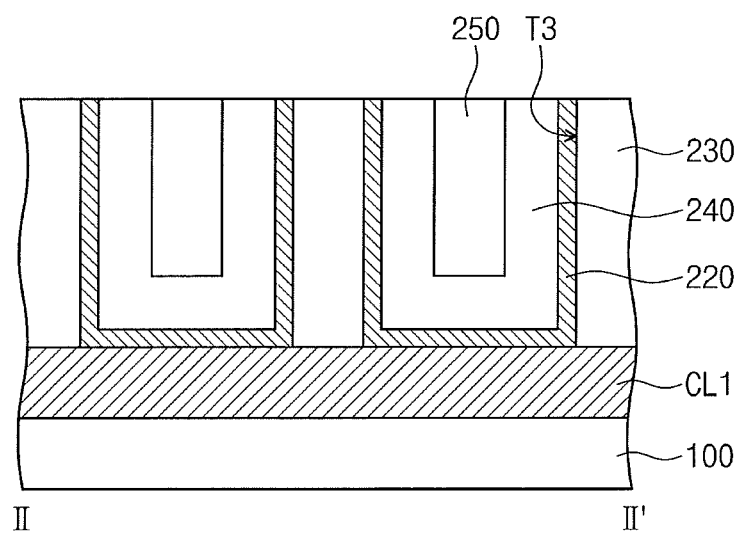

Referring to FIGS. 22A and 22B, first conductive lines CL1 may be formed on a substrate 100, and then, a third interlayered insulating layer 210 may be formed to cover the first conductive lines CL1. In some embodiments, the formation of the first conductive lines CL1 may include forming a conductive layer (not shown) on the substrate 100 and then patterning the conductive layer. The formation of the third interlayered insulating layer 210 may include forming an insulating layer on the substrate 100 to cover the first conductive lines CL1, and then planarizing the insulating layer to expose top surfaces of the first conductive lines CL1. In certain embodiments, the formation of the first conductive lines CL1 may include forming the third interlayered insulating layer 210 on the substrate 100 to define trenches extending in the first direction D1, forming a conductive layer to fill the trenches, and planarizing the conductive layer to expose a top surface of the third interlayered insulating layer 210.

A first insulating layer 230 may be formed on the third interlayered insulating layer 210. The first insulating layer 230 may be formed to have third trenches T3 extending in the second direction D2. Each of the third trenches T3 may be formed to expose top surfaces of the first conductive lines CL1, which are arranged in the second direction D2, and a top surface of the third interlayered insulating layer 210. For example, the first insulating layer 230 may be formed of or include silicon nitride.

An electrode layer 220, a spacer layer 240, and a second insulating layer 250 may be formed in each of the third trenches T3. The electrode layer 220 may be formed to cover inner side surfaces and a bottom surface of each of the third trenches T3 and to fill at least a portion of each of the third trenches T3. The spacer layer 240 may be formed to cover a top surface of the electrode layer 220 and to fill at least a portion of each of the third trenches T3. The electrode layer 220 may extend between the spacer layer 240 and the inner side and bottom surfaces of each of the third trenches T3. The second insulating layer 250 may be formed to cover a top surface of the spacer layer 240 and to fill a remaining portion of each of the third trenches T3. As an example, the formation of the electrode layer 220, the spacer layer 240, and the second insulating layer 250 may include sequentially depositing the electrode layer 220, the spacer layer 240, and the second insulating layer 250 on the first insulating layer 230 to fill the third trenches T3 and then, planarizing the electrode layer 220, the spacer layer 240, and the second insulating layer 250 to expose a top surface of the first insulating layer 230. The electrode layer 220, the spacer layer 240, and the second insulating layer 250, which are formed in each of the third trenches T3, may extend in the second direction D2.

The electrode layer 220 may be formed using the layer-forming method described above with reference to FIGS. 1 to 11. As described with reference to FIGS. 1 to 3, the substrate 100, on which the first insulating layer 230 with the third trenches T3 is formed, may be loaded on the stage 20 of the deposition system 500 (in S100 of FIGS. 1 and 2). The method of forming the electrode layer 220 may be substantially the same as the method described with reference to FIGS. 16A and 16B (e.g., for forming the first electrode layer 120). The electrode layer 220 may be formed of or include TiSiN. The electrode layer 220 may be formed by an atomic layer deposition method and may be deposited at a deposition temperature that is lower than a phase transition temperature of a switching device to be described below. The electrode layer 220 may be deposited at a temperature that is equal to or higher than about 300° C. and is lower than about 400° C. After the formation of the electrode layer 220, the substrate 100 may be unloaded from the stage 20 of the deposition system 500.

The spacer layer 240 may include a material having an etch selectivity with respect to the third interlayered insulating layer 210 and the first insulating layer 230. The second insulating layer 250 may include a material having an etch selectivity with respect to the spacer layer 240. As an example, the second insulating layer 250 may be formed of or include silicon nitride.

Figure 23A:
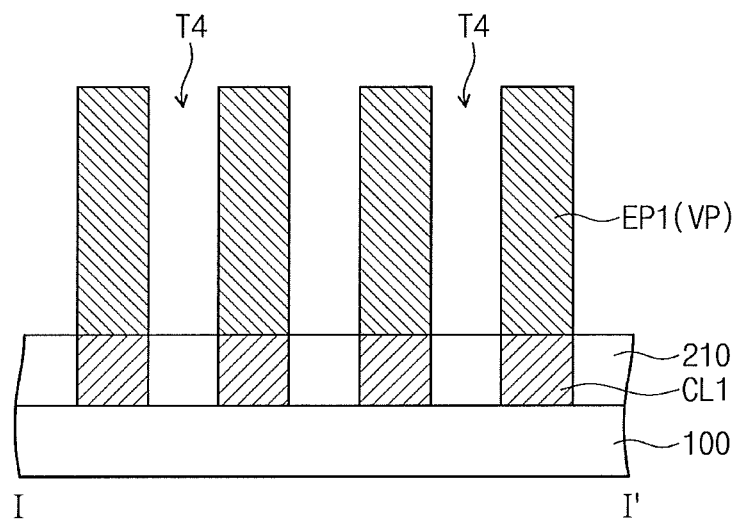
Figure 23B:
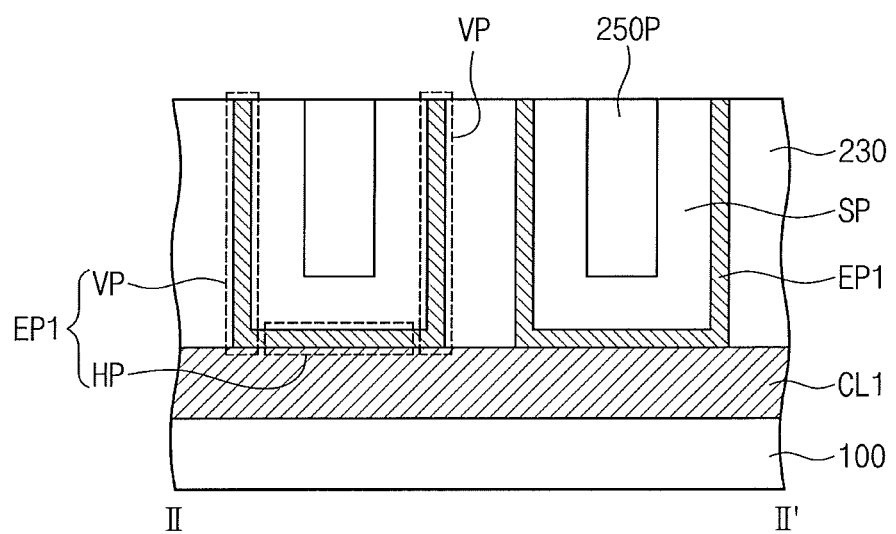

Referring to FIGS. 23A and 23B, the electrode layer 220, the spacer layer 240, and the second insulating layer 250 of FIGS. 22A and 22B may be patterned to form fourth trenches T4 extending in the first direction D1. As a result of the formation of the fourth trenches T4, the electrode layer 220 may be divided into first electrodes EP1, which are spaced apart from each other in the second direction D2; and, the spacer layer 240 may be divided into spacers SP, which are spaced apart from each other in the second direction D2. As a result of the formation of the fourth trenches T4, the second insulating layer 250 may be divided into second insulating patterns 250P, which are spaced apart from each other in the second direction D2. Each of the first electrodes EP1 may include vertical portions VP, which are provided on the inner side surfaces of each of the third trenches T3, and a horizontal portion HP, which is provided on the bottom surface of each of the third trenches T3. The vertical portions VP may be electrically connected to each other through the horizontal portion HP. Each of the spacers SP may be provided between the vertical portions VP of each of the first electrodes EP1. Each of the spacers SP may be provided on opposite side surfaces of the vertical portions VP and may extend along a top surface of the horizontal portion HP. Each of the second insulating patterns 250P may be provided between the vertical portions VP of each of the first electrodes EP1 and may be spaced apart from the vertical portions VP of each of the first electrodes EP1 by each of the spacers SP interposed therebetween.

Figure 24A:
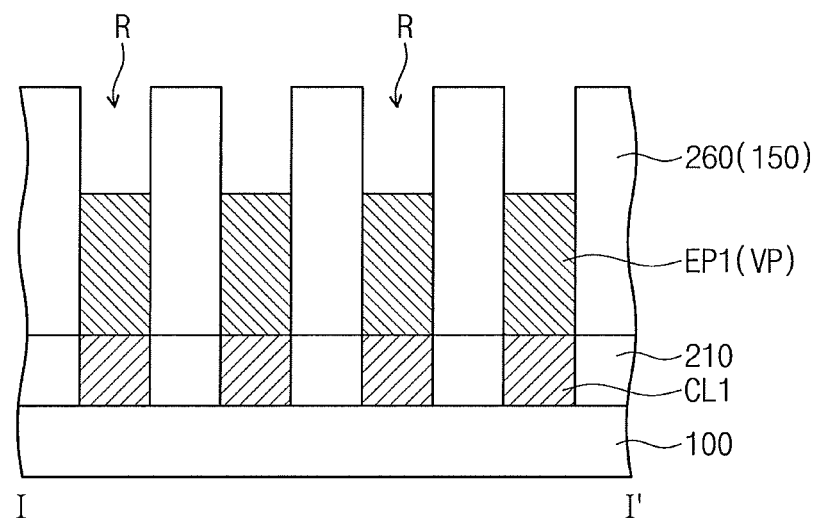
Figure 24B:
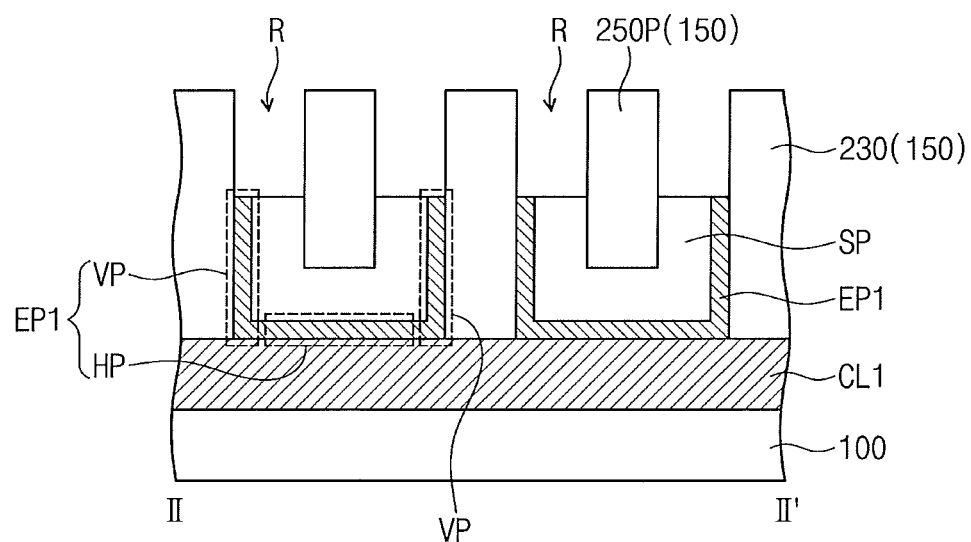

Referring to FIGS. 24A and 24B, a third insulating layer 260 may be formed on the third interlayered insulating layer 210 to fill the fourth trenches T4 of FIG. 23A. The third insulating layer 260 may include the same insulating material as that of the first insulating layer 230 or the second insulating pattern 250P. As an example, the third insulating layer 260 may be formed of or include silicon nitride. The first insulating layer 230, the second insulating pattern 250P, and the third insulating layer 260 may constitute a first interlayered insulating layer 150 (as labeled in parentheses in FIGS. 24A and 24B).

Upper portions of the first electrodes EP1 and upper portions of the spacers SP may be etched to form recess regions R in the first interlayered insulating layer 150. The recess regions R may be formed to expose respective ones of the vertical portions VP of the first electrodes EP1. The recess regions R may be formed in the first interlayered insulating layer 150 and may be spaced apart from each other in both of the first and the second directions D1 and D2.

Figure 25A:
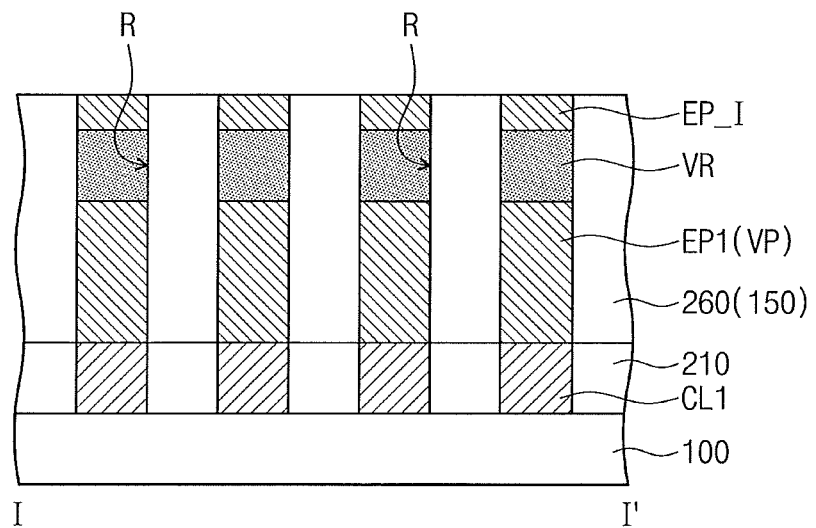
Figure 25B:
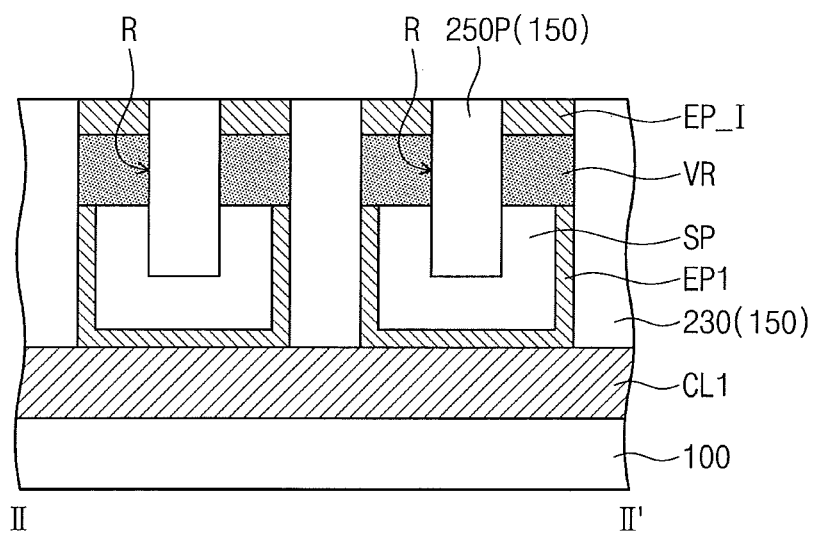

Referring to FIGS. 25A and 25B, variable resistance structures VR may be formed in the recess regions R, respectively. Each of the variable resistance structures VR may be formed to fill a portion (e.g., a lower portion) of a corresponding one of the recess regions R. Intermediate electrodes EP_I may also be formed in the recess regions R, respectively. The intermediate electrodes EP_I may be formed on the variable resistance structures VR, respectively. Each of the intermediate electrodes EP_I may be formed to fill a remaining portion (e.g., an upper portion) of a corresponding one of the recess regions R.

The formation of the intermediate electrodes EP_I may include forming an intermediate electrode layer on the first interlayered insulating layer 150 to fill the recess regions R, and then, performing a planarization process to expose the first interlayered insulating layer 150. The intermediate electrode layer may be formed using the layer-forming method described with reference to FIGS. 1 to 11. The intermediate electrode layer may be formed by substantially the same method as that described above for forming the first electrode layer 120 described with reference to FIGS. 16A and 16B. The intermediate electrode layer may be formed using an atomic layer deposition method and may be deposited at a temperature lower than a phase transition temperature of a switching device to be described below. For example, the intermediate electrode layer may be deposited at a temperature that is equal to or higher than about 300° C. and is lower than about 400° C.

Referring back to FIGS. 21A and 21B, switching devices SW may be formed on the first interlayered insulating layer 150. The switching devices SW may be formed on the intermediate electrodes EP_I, respectively. The second electrodes EP2 may be formed on the switching devices SW, respectively. A second interlayered insulating layer 160 may be formed on the first interlayered insulating layer 150 to cover the switching devices SW and the second electrodes EP2. The formation of the second electrodes EP2 may include depositing and patterning an additional electrode layer. The additional electrode layer may be formed using the layer-forming method described above with reference to FIGS. 1 to 11. The additional electrode layer may be formed by substantially the same method as that described above for forming the first electrode layer 120 described with reference to FIGS. 16A and 16B. The additional electrode layer may be formed by an atomic layer deposition method and may be deposited at a temperature lower than a phase transition temperature of the switching device SW. As an example, the additional electrode layer may be deposited at a temperature that is equal to or higher than about 300° C. and is lower than about 400° C.

Second conductive lines CL2 may be formed on the second interlayered insulating layer 160. The second conductive lines CL2 may be formed by substantially the same method as that described above for forming the first conductive lines CL1. The second conductive lines CL2 may extend in the second direction D2 and may be formed to be spaced apart from each other in the first direction D1.

In the case where the variable resistance memory device includes a plurality of memory cell stacks, the process for forming the first and second conductive lines CL1 and CL2, respectively, and the first memory cell stack MCA1 may be repeated.

According to some embodiments of the inventive concept, a low temperature deposition process may be performed to easily form a layer with desired characteristics. In addition, at least one electrode pattern with desired characteristics may be formed by using a deposition process to be performed at a temperature lower than a phase transition temperature of a switching device, and this may make it possible to fabricate a variable resistance memory device with high reliability at an increased yield.

While exemplary embodiments of the inventive concept have been particularly shown and described, it will be understood by one of ordinary skill in the art that variations in form and detail may be made therein without departing from the spirit and scope of the attached claims.

What is claimed is:

1. A method of forming a target layer for a semiconductor device, comprising performing a unit process at least one time,
    wherein the unit process comprises:
        forming a first layer on a substrate by performing a first process at least one time; and
        forming a second layer on the first layer by performing a second process at least one time,
    wherein the first process consists of a set of sequential steps selected from set (A) or set (B) wherein: set (A) consists of the steps of:
        (A)(1) supplying a first source gas;
        (A)(2) supplying an inert gas;
        (A)(3) supplying a second source gas n times, where n is an integer equal to or greater than 2; and
        (A)(4) supplying an inert gas m times, where m is an integer equal to or greater than 2; and,
    set (B) consists of the steps of:
        (B)(1) supplying a first source gas;
        (B)(2) supplying an inert gas;
        (B)(3) supplying a second source gas;
        (B)(4) supplying an inert gas; and,
        (B)(5) repeating steps (B)(3) and (B)(4) sequentially n times, where n is an integer equal to or greater than 2.

2. The method of claim 1, wherein the first process consists of the set (A) steps and the steps (A)(2) and (A)(4) of supplying the inert gas comprise:
    after the step (A)(1) of supplying the first source gas and before the step (A)(3) of supplying the second source gas n times, supplying the inert gas to purge an over-supplied fraction of the first source gas; and
    after the step (A)(3) of supplying the second source gas n times, supplying the inert gas m times to purge a reaction by-product which is generated by a reaction between the first and second source gases.

3. The method of claim 1, wherein the first process consists of the set (B) steps and the steps (B)(2) and (B)(4) of supplying the inert gas comprise:
    after the step (B)(1) of supplying the first source gas and before the step (B)(3) of supplying the second source gas, supplying the inert gas to purge an over-supplied fraction of the first source gas
    after each step (B)(3) of supplying the second source gas, supplying the inert gas to purge a reaction by-product which is generated by a reaction between the first and second source gases.

4. The method of claim 1, wherein the first source gas is a Ti-containing gas,
    the second source gas is a N-containing gas,
    the forming of the first layer comprises performing the first process at least one time to form a TiN layer,
    the second layer formed is a SiN layer, and
    the target layer faulted is a TiSiN layer.

5. The method of claim 1, wherein the first source gas is a Si-containing gas,
    the second source gas is a N-containing gas,
    the forming of the first layer comprises performing the first process at least one time to form a SiN layer,
    the second layer formed is a TiN layer, and
    the target layer formed is a TiSiN layer.

6. The method of claim 1, wherein the second process consists of a set of sequential steps selected from set (C) or set (D) wherein: set (C) consists of the steps of:
    (C)(1) supplying a third source gas;
    (C)(2) supplying an inert gas;
    (C)(3) supplying the second source gas n times, where n is an integer equal to or greater than 2; and
    (C)(4) supplying the inert gas m times, where m is an integer equal to or greater than 2; and,
    set D consists of the steps of:
    (D)(1) supplying a third source gas;
    (D)(2) supplying an inert gas;
    (D)(3) supplying a second source gas;
    (D)(4) supplying an inert gas; and,
    (D)(5) repeating steps (D)(3) and (D)(4) sequentially n times, where n is an integer equal to or greater than 2, and
    wherein the third source gas is different from the first source gas.

7. The method of claim 6, wherein the first source gas is a Ti-containing gas,
    the second source gas is a N-containing gas,
    the third source gas is a Si-containing gas,
    the forming of the first layer comprises performing the first process at least one time to form a TiN layer,
    the forming of the second layer comprises performing the second process at least one time to form a SiN layer, and
    the target layer formed is a TiSiN layer.

8. The method of claim 7, wherein the first process and the second process are performed at a temperature that is equal to or higher than about 300° C. and is lower than about 400° C.

9. The method of claim 6, wherein the second process consists of the set (C) steps and, during the second process, the steps (C)(2) and (C)(4) of supplying the inert gas comprise:
    after the step (C)(1) of supplying the third source gas and before the step (C)(3) of supplying the second source gas n times, supplying the inert gas to purge an over-supplied fraction of the third source gas; and after the step (C)(3) of supplying the second source gas n times, supplying the inert gas m times to purge a reaction by-product which is generated by a reaction between the third and second source gases.

10. The method of claim 6, wherein the second process consists of the set (D) steps and, during the second process, the steps (D)(2) and D(4) of supplying the inert gas comprise:

after the step (D)(1) of supplying the third source gas and before the step (D)(3) of supplying the second source gas, supplying the inert gas to purge an over-supplied fraction of the third source gas; and after each step (D)(3) of supplying the second source gas, supplying the inert gas to purge a reaction by-product which is generated by a reaction between the third and second source gases.

\* \* \* \* \*